United States Patent [19]
Sebastian et al.

[11] Patent Number: 5,822,206
[45] Date of Patent: *Oct. 13, 1998

[54] CONCURRENT ENGINEERING DESIGN TOOL AND METHOD

[75] Inventors: Donald Sebastian, Parlin, N.J.; Steven Pratt, Plantation, Fla.; Sivakumar Muthuswamy, Plantation, Fla.; David Johann Kniep, Metuchen, N.J.; Souran Manoochehri, Scotch Plains, N.J.; Scott Kolodzieski, Basking Ridge, N.J.

[73] Assignee: The Trustees of the Stevens Institute of Technology, Hoboken, N.J.

[ * ] Notice: The term of this patent shall not extend beyond the expiration date of Pat. No. 5,552,995.

[21] Appl. No.: 706,385

[22] Filed: Aug. 30, 1996

(Under 37 CFR 1.47)

Related U.S. Application Data

[63] Continuation of Ser. No. 158,125, Nov. 24, 1993, Pat. No. 5,552,995.
[51] Int. Cl.[6] .................................................. G06F 19/00
[52] U.S. Cl. .............................. 364/468.03; 364/474.21; 364/474.24
[58] Field of Search ........................ 364/474.01, 474.03, 364/474.04, 474.21, 474.22, 474.23, 474.24, 148, 191–193; 395/919, 920, 921, 923, 613, 615

[56] References Cited

U.S. PATENT DOCUMENTS

| | | | |
|---|---|---|---|
| 4,862,376 | 8/1989 | Ferriter et al. | 364/468.03 |
| 5,089,970 | 2/1992 | Lee et al. | 364/468.03 |
| 5,109,337 | 4/1992 | Ferriter et al. | 364/468.14 |
| 5,119,307 | 6/1992 | Blaha et al. | 364/468.03 |
| 5,357,440 | 10/1994 | Talbott et al. | 364/468.14 |
| 5,359,523 | 10/1994 | Talbott et al. | 364/468.14 |
| 5,552,995 | 9/1996 | Sebastian | 364/468.03 |
| 5,630,041 | 5/1997 | Mills et al. | 395/141 |
| 5,664,180 | 9/1997 | Halpert et al. | 395/613 |
| 5,680,317 | 10/1997 | Watanabe | 364/474.24 |

OTHER PUBLICATIONS

Izuhchikwu, J., "Artificial Intelligence Can Reduce Product Cost By Optimizing Design Decisions," *IE,* Aug. 1991, pp. 42–46.

Chen, J.L. et al, "An Intelligent Database System for Composite Material Selection in Structural Design," *Expert Systems With Applications,* 1993, vol. 6, pp. 159–168.

Zhang, Hong–chao et al., "Design–Decision Support in Concurrent/Simultaneous Engineering," *Control and Dynamics Systems.* 1994, vol. 62, pp. 171–196.

Martin, Norman, "Knowledge–Based Engineering." *Automotive Industries,* Jul. 1994, pp. 50–53.

(List continued on next page.)

*Primary Examiner*—Reba I. Elmore
*Assistant Examiner*—Thomas E. Brown
*Attorney, Agent, or Firm*—Kenyon & Kenyon

[57] ABSTRACT

A computer-based engineering design system to design a part, a tool to make the part, and the process to make the part. The design system has a processor and a memory. The memory stores feature templates, each feature template being a representation of a primitive object having a form and a function. Each feature template is indexed by the function of the primitive object and includes a representation of a primitive geometric entity having the form of the primitive object. Each feature template can include information relating to a tool to make the primitive object and a process to make the primitive object. The design system also includes an input device for receiving a request to design the part. This request includes one or more predetermined functions that the part performs. A core design module, executable by the processor, designs the part, the tool to make the part and process to make the part by accessing the plurality of feature templates in the memory to locate one or more primitive objects that perform the one or more predetermined functions.

26 Claims, 10 Drawing Sheets

OTHER PUBLICATIONS

Ashley, Steven, "DARPA Initiative in Concurrent Engineering," *Mechanical Engineering,* Apr. 1992, pp. 54–57.

Cutkosky, Mark R. et al. "PACT: An Experiment in Integrating Concurrent Engineering Systems," *Computer,* Jan. 1993, pp. 28–37.

Dowlatshahi, Shad, "A Novel Approach to Product Design and Development in a Concurrent Engineering Environment," *Technovation,* 1993, vol. 13, No. 3, pp. 161–176.

Sahu, Kaushik et al, "Concurrent Iterative Design and the Integration of Finite Element Analysis Results," *Engineering with Computers,* 1994, pp. 245–247.

Creese, Robert C. et al, "Cost Modeling for Concurrent Engineering," *Cost Engineering,* Jun. 1990, vol. 32, No. 6, pp. 23–27.

McLeod, Jonah, "A New Kind of Engineering Fuels Cad," *Electronics,* Apr. 1990, pp. 50–53.

Brazier, David et al, "Concurrent Engineering: Participating in Better Designs," *Mechanical Engineering,* Jan. 1990, pp. 52–53.

Martin, Merle P. et al, "Using Computer Knowledge in the Design of Interactive Systems," *Int. J. Man–Machine Studies,* 1987, vol. 26, pp. 333–342.

Izuchukwu, John, "Architecture and Process: The Role of Integrated Systems in Concurrent Engineering Introduction," *IM,* Mar./Apr. 1992, pp. 19–23.

St. Charles, D., "Don't Toss it Over–Break Down the Walls," *Automation,* Jun. 1990, pp. 68–69.

O'Grady, Peter et al, "An Advice System for Concurrent Engineering," *Int. J. Computer Integrated Manufacturing,* 1991, vol. 4, No. 2, pp. 63–70.

Ben–Arieh, D. et al, "Modeling Advanced Manufacturing Systems Using Concurrent Logic Programming," *Artificial Intelligence in Engineering,* 1990, vol. 5, No. 1, pp. 43–49.

Kott, Alexander et al, Role of Product Modeling in Concurrent Engineering Environments, *International Journal of Systems Automation: Research and Applications,* 1992, vol. 2, pp. 1–16.

Pinto, Nabil B. et al, "IPAD: Intelligent Parameter Design Assistant," *International Journal of Systems Automation: Research and Applications,* 1992, vol. 2, pp. 37–47.

Kamal, O. et al, "Automatic Partitioning of Frame Structures of Concurrent Processing," *Microcomputer in Civil Engineering,* 1990, vol. 5, No. 4, pp. 269–283.

Cutkowsky, M.R. et al., "Working with Multiple Representations in a Concurrent Design System," Transactions of the ASME, *Journal of Mechanical Design,* Sep. 1992, vol. 114, pp. 515–524.

Pavliscak, Thomas J. et al, "Design for Manufacturing and Assembly and Concurrent Engineering in Electro–Optical Systems," *Control and Dynamics Systems,* vol. 62, 1994, pp. 197–226.

Floss, P. et al., "A Knowledge–based Design Assistant for Intelligent Manufacturing Systems," *Journal of Manufacturing Systems,* 1992, vol. 9, No. 2, pp. 87–102.

Bowen, James et al, "Constraint–Based Software for Concurrent Engineering," *Computer,* Jan. 1993, pp. 66–68.

Forgionne, Guisseppi A., "IMDS: A Knowledge–Based System to Support Concurrent Engineering at Westinghouuse," *Expert Systems With Applications,* 1993, vol. 6, pp. 193–202.

Austin, Colin,"Concurrent Design Brings Out the Best in CAE," *Plastics Engineering,* Dec. 1991, pp. 23–26.

Jo, Hyeon H. et al, "Current Engineering: The Manufacturing Philosophy For the 90's," *Computers and Indust. Engineering,* 1991, vol. 21, Nos. 1–4, pp. 35–39.

Wong, Julius P. et al, "An Integrated Cost Estimating System for Concurrent Engineering Environment," *Computers and Industrial Engineering,* 1992, vol. 21, Nos. 1–4, pp. 589–594.

Larson, Eric, "Designing Better Thermoplastic Parts," *Machine Design,* Feb. 7, 1991, pp. 83–85.

McCarty, L.H., "CAD/CAM System Speeds Concurrent–Engineering Effort," *Design News,* vol. 47, No. 17, Sep. 9, 1992, p. 26.

Maliniak, Lisa, "Design Automation Takes Over More Tasks Early On," *Electronic Design,* Jun. 13, 1991, pp. 47, 58, 61.

"Concurrent Engineering for Product Realization, First CIRP International Workshop, Tokyo, Japan, 27–28 Jun. 1992," *Computers in Industry,* pp. 337–338.

Huyn, P.N. et al., "Automated Concurrent Engineering in Designworld," *COMPUTER,* Jan. 1993, pp. 74–76.

Montreuil, Benoit et al., "Object Knowledge Environment for Manufacturing Systems Layout Design", *International Journal Of Intelligent Systems,* vol. 3, pp. 339–410 (1988).

Gay, Robert K. L. et al., "Network–based concurrent design environment for distributed–based CAD", *Computing & Control Engineering Journal,* Dec. 1993 pp. 253–260.

Dewan, Prasun et al., "Toward Computer–Supported Concurrent Software Engineering", *Computer,* pp. 17–27 Jan. 1993.

Lenau, T. et al., "Intelligent Support System for Product Design," *Annals of the AIRP,* vol. 38/1/1989, pp. 153–156.

Anumba C.J. et al., "An innovative approach towards designer–oriented CAD systems", *The Structural Engineer,* 70, No. 9 May 5, 1992 pp. 165–168.

Klein, March, "Capturing Design Rationale in Concurrent Engineering Teams", *Computer,* Jan. 1993, pp. 39–47.

Reddy, Tamana Y.V. et al., "Computer Support for Concurrent Engineering", *Computer,* Jan. 1993 pp. 12–15.

Michael, W. et al., "Computer simulation optimizes RIM part design and cuts development costs", *Modern Plastics,* Jul. 1994, pp. 65–67.

Lee, M. H. "Towards intelligent design and diagnosis tolls for electrical and mechanical engineering", *Computing & Control Engineering Journal,* Jul. 1992, pp. 172–177.

Puttre, Michael, "Putting Optimization Routines in The Loop", *Mechanical Engineering,* Jul. 1993 pp. 76–80.

Bashkevich N. P., et al., "Application of Artificial Intelligence Techniques to the Design of Intelligent External and Mass Storage Management Systems", *Scripta Technica, Inc.,* 1993, pp. 88–97.

Ohsuga, Setsuo, "Toward Intelligent CAD Systems", vol. 21 No. 5, Jun. 1989, pp. 315–337.

Smithers T., "Al–based design versus geometry–based design or Why design cannot be supported by geometry alone", vol. 21, No. 3, Apr. 1989, pp. 141–150.

Roy, G.G., et al., "Expert Systems as Design Aids An Application to the Design of Fireplaces," pp. 107–115.

Avrunin, George S., et al., "Automated Analysis of concurrent Systems With the Constrained Expression Toolset", *IEEE Transactions on Software Engineering,* 17, No. 11, Nov. 1991, pp. 1204–1221.

Yoshimura, Masatake et al., "Integrated optimization of machine product design and process design", *Int. J. Prod. Res.,* 1989, vol. 27, No. 8, pp. 1241–1255.

Leonard, LaVerne, "Why CAD Software can't replace the designer–yet", *Plastics Design Forum,* Nov./Dec. 1993, pp. 58–61.

Lee, Hauhua et al., "Heuristic Redesign and Rule Formulation for Complex Engineering Designs", *Department of Mechanical and Aerospace Engineering Rutgers, The State University of New Jersey,* pp. 377–392.

Xue, Deyi, et al., "Automated Concurrent Design Based on Combined Feature, Tolerance, Production Process and Cost Models", *Advances in Design Automation,* vol. 2 ASME 1993, pp. 199–210.

Whitney, Daniel E., et al., "Tools For Strategic Product Design" Massachusetts Institute of Technology, pp. 581–595.

Sprague R. A. et al., "Concurrent Engineering in Product Development", *Concurrent Engineering,* Mar. 1991, pp. 6–13.

Pennell James P. et al., "Concurrent Engineering: Practices and Prospects" *IEEE,* 1989, pp. 0647–0655.

Nau, D.A. et al., "SIPS: An Application of Hierarchical Knowledge Clustering to Process Planning," *Winter Annual Meeting, ASME,* Dec. 1986, pp. 219–225.

Pennel James P. et al., "Concurrent Engineering: An Overview of Autotestcon", *IEEE,* 198, pp. 88–99.

Dighe, Rahul et al., "Computer–Automated Functional Design of Injection Molded Product Housings", *Design Theory and Methodology,* vol. 42, ASME 1992, pp. 45–55.

Altenhof, Jeffrey L. et al., "Concurrent Mechanical system Design: A Compuer–Aided Demonstration", pp. 103–109.

Pakdy, Sisir K., et al., "An Object–Oriented Knowledge–Based system For Assembly Of Printed Circuit Boards", *Advances in Design Automation,* 1, ASME 1991, pp. 43–54.

Dwivedi, Suren N. Dr., et al., "Concurrent Engineering–Why and What?", *IEEE,* 1990, pp. 142–148.

Gandhi A., et al., "A Natural Language Approach To Feature Based Modeling", pp. 69–77.

Jacob, Robert J. K., "A Software Engineering Methodology for rule–Based Systems", *IEEE Transactions On Knowledge and Data Engineering,* 2, No. 2 Jun. 1990, pp. 173–189.

Guo, Wei e al., "Integrated Intelligent Design Environment For Design Management and Cooperation", *Design Theory and Methodology,* vol. 42, ASME 1992, pp. 157–166.

Fenves Gregory L. "Object–Oriented Programming for Engineering software Development", *Engineering With Computers,* 6, pp. 1–15 (1990).

Leohard, LaVerne, "Concurrent engineering is coming soon to a screen near you", *Plastics Design Forum,* Sep./Oct. 1993, pp. 26–34.

Balakrishman, Ravishankar et al., "Knowledge Based Expert System For Forging Die Design", *IEEE,* 1988, pp. 498–504.

Colton Jonathan S., et al., "An Intelligent Design for Manufacture System", pp. 657–666.

Gadh, Rajit, "A Hybrid Approach To Intelligent Geometric Design Using Features–Based Design and Feature Recognition", *Advances in Design Automation,* 2, ASME 1993, pp. 273–283.

Ishii, Kosuke, "Keys to the Successful Development of an AI–Based Tool for Life–Cycle Design", 20 pages.

"Function Based Design for Injection Molding", D.H. Sebastian, *Proceedings 1993 SPE ANTEC,* New Orleans, LA, pp. 1114–1119 (May 10, 1993).

"Automated Concurrent Engineering", D.H. Sebastian, Proceedings 7th International Conference on Concurrent Engineering —Orlando, The Management Roundtable, (Oct. 1993).

"Designing with Features: The Origin of Features", J.J. Cunningham and J.R. Dixon, *Proceedings ASME Computers in Engineering Conference,* ASME, V1, pp. 237–243 (1988).

"Feature Based Geometry Constuction fo Geometric Reasoning", J.C.H. Chung, R.L. Cook, D. Patel, and M.K. Simmons, *Proceedings ASME Computers in Engineering Conference,* San Francisco, CA, pp. 497–504 (1988).

"Integrating CAE, Features, and Iterative Redesign to Automat the Design of Injection Molds", R.K. Irani, B.H. Kim & J.R. Dixon, *Proceedings ASME Computers in Engineering Conference,* Annaheim, CA, pp. 27–33 (1989).

"A Knowledge Based Engineering System for the Design of Injection Molded Plastic Parts", S.D. Pratt, M. Sivakumar, and S. Manoochehri, *Advances in Design Automation,* 65(1), pp. 287–295 (1993).

"Integrated Mold and Die Design and Manufacturing System", K. Fukuoka and K. Horiuchi, *Fujitsu Sci. Tech. J.,* 22(5), pp. 438–450 (1986).

"Computer–Aided Plastic Parts Design for Injection Molding", G. Menges, W. Michaeli, E. Baur, B. Lessenich, and C. Schwenzer, *Advances in Polymer Technology,* 8(4), 355–365 (1988).

"Intelligent Design System for Injection Molded Parts Based on the Process Function Analysis Method", H. Hamada, L.J. Leifer, NSF Engineering Design Research Conference, 597–612 (1989).

"A Statistical/Heuristic Approach to Estimating Mold Costs", D. Pearce, *Plastics Engineering,* 6, pp. 51–53 (1989).

Product Literature for Wisdom Systems "Concept Modeller".

Product Literature for ICAD extracted from "Introducing the ICAD System," by Martin R. Wagner, published 1990.

Product Literature for Dsign Intent!, Design Intent Software, Inc., described product released in 1993, date of distribution of literature unknown.

Product Literature for Cognition, Release 13, describes product released in 1993, due of distribution of literature unknown.

*Principles & Polymerization Engineering,* John Wiley & Sons, 1983, pp. 728–735, 550–559.

*Temperature Control Principles for Process Engineers,* Hanser Publishers, 1994, pp. 19–33.

*Applications of Computer Modeling for Extrusion and Other Continuous Processes,* Hanser Publishers, 1992, pp. 367–401.

*Concurrent Engineering, The Product Development Environment for the 1990's.* Addison–Wesley Publishing Company, Inc., 1992, pp. 98–121.

"Computer–Aided Process Planning for Turned Parts Using Fundamental and Heuristic Principles", U.P. Korde et al., *Journal of Engineering for Industry,* Feb. 1992, vol. 114, pp. 31–40.

"Candidate Machining Sequence Generation for Optimal Process Planning Using a Knowledge–Based System", Z. Dong et al., IEEE Pacific Rim Conference Communications, Computers and Signal Processing, May 9–10, 1991, pp. 569–572.

"A Knowledge–Based System for Machining Operation Planning", Brian E. Barkocy et al. *The Carbide and Tool Journal* Jul.–Aug. 1985 (CASA/SMA Autofact 6 Conference, Oct. 1984), pp. 257–262.

"A Logic–Based Integrated Manufacturing Planning System", Jerry Y.–H. Fuh et al., *Computers in Engineering,* vol. 1, ASME 1992, pp. 391–400.

"Feature–Based Process Planning in the AMRF", M.B. Unger et al., National Bereau of Standards, pp. 563–569, *Computers in Engineer 1988 —Proceedings,* San Francisco, CA, Jul.–Aug. 4, 1988.

"Feature–Based Process Planning for Machined Parts", A.H. Bond et al., pp. 571–576, *Computers in Engineer 1988—Proceedings,* San Francisco, CA, Jul. 31–Aug. 4, 1988.

"Feature Based Modeling Shell: Design and Implementation", J.J. Shah et al., pp. 255–261, *Computers in Engineer 1988 —Proceedings,* San Fancisco, CA, Jul. 31–Aug. 4, 1988.

"A Library of Material Removal Shape Element Volumes (MRSEVs)", Thomas R. Kramer, *U.S. Department of Commerce,* Mar. 1992, pp. i–iii, 1–63.

"PC–CAPP–a Computer–Assisted Process Planning System for Prismatic Components", S.S. Pande e tal., Computer–Aided Engineering Journal, Aug. 1989, p. 133–138.

"Construction of Multiple Prototype Parts From Computer––Generated Master Models", D. Dahl, Rapid Prototyping and Manufacturing '93 Conference, May 11–13, 1993, Section 10.

"Prototype CBC Injection Molds from SLA Patterns", D. Santin, Rapid Prototyping and Manufacturing '93 Conference, May 11–13, 1993, Section 31.

"Rapid Prototyping Technology: Benchmarking Comparison", Rapid Prototyping and Manufacturing '93 Conference, May 11–13, 1993, Section 33.

```
                    Concurrent, Feature - Template
  Name::Plastic_Molded_Box_System
  Part::Box_Part_1993  ⎤
  Material::ABS        |
  Tool::Box_Tool_1993  ⎬ 201
  Process::Box_Process_1993 ⎦
  ⋮
                                                      202

Part, Feature - Template
  Name::Box_Part_1993
  Function::Electronics_Enclosure
  Form::Macro_Feature
  Normal.x=User_Input
  Normal.y=User_Input
  Normal.z=User_Input
  Sub_Part_List=(Part.Box_1,Part.Boss_1,Part.Boss_2,Part.Boss_3,Part.Boss_4...)
  Volume=SUM(Part.".Volume)
  Cost=Material.Price"Material.Solid_Density"Volume
  ⋮                                                  203

Sub_Part, Feature - Template
  Name::Boss_1
  Function::Attach
  Form::Simple_Boss
  My_Wall=Nearest_Wall (Index)
  Location.x=User_Input
  Location.y=User_Input                    ┌────────┐
  Location.z=User_Input                    │FIG. 2A │
  Height=User_Input                        ├────────┤
  Inner_Diameter = User_Input              │FIG. 2B │
  Normal.x=My_Wall.Normal.x ⎤              └────────┘
  Normal.y=My_Wall.Normal.y ⎬ 205
  Normal.z=My_Wall.Normal.z ⎦                      207
  Thick_Burst=Burst_Load " Inner_Diameter/Material.Yield_Strength  ⎫
  Thick_Bend=8" Bend_Load " Height ^3/3" Pi " Material.Modulus " Inner_Diameter^3 ⎬
  Wall_Thickness=MAX(Thick_Burst. Thick_Bend)
  Outer_Diameter=Inner_Diameter + Wall_Thickness
  Hole_Depth = Height + 0.5" My_Wall.Wall_Thickness ⎫ 209
  Base_Radius = 0.25" My_Wall.Wall_Thickness        ⎭
  Draft_Angle = If (Normal.x = Tool.Normal.x)AND (Normal.y = Tool.Normal.y) AND ⎫
               (Normal.z = Tool.Normal.z) Then 2 Else 0                          ⎭
  Volume = Pi" (Outer_Diamer^2 - Inner_Diameter^2) " Height
  ⋮                                                        211
  ⋮

Material, Feature - Template
  Name::ABS
  Function::Construction
  Form::Macro_Feature
  Price::3.50
  ⋮                                                       213
                      Sub_Material, Feature - Template
   Name::Youngs_Modulus
   Function::Deformation_Resistance
   Modulus = LOOKUP(Resin_Modulus, Process.Machine_Size)
   ⋮
  ⋮                                               210           206
```

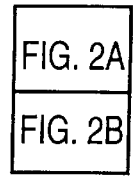

FIG. 2A

CONCURRENT ENGINEERING DESIGN TOOL AND METHOD

This application is a continuation of U.S. patent application Ser. No. 08/158,125, filed Nov. 24, 1993, now U.S. Pat. No. 5,552.995.

FIELD OF INVENTION

The present invention is directed to a computer system for automated concurrent engineering, and more particularly, to a method and apparatus for the concurrent design of parts, tools and processes.

BACKGROUND OF THE INVENTION

Concurrent engineering aims to integrate product design and manufacturing cycles in a systematic way to facilitate the swift, cost-effective progression of new products from raw concept to end customer.

Traditionally, when designing a new product, a team of designers usually participate in what is known as a product development cycle. In general terms, the first stage in designing a new product is that of concept design, in which overall needs and aims are addressed.

Next is the initial design stage. The initial design stage comprises steps of designing the part, then choosing the materials and determining the process to make the part, then designing the tool to make the part. For example, if the part is to be a computer keyboard, first the size and shape of the keyboard (i.e., the part) is determined by a part engineer. Next, when the part has been designed, a second engineer determines the design of the tool that can be used to make the keyboard. Separately, a process engineer determines the materials and process to make the part, for example, whether the part is to be made of plastic, metal or some other material, the properties of the material, the process to be used to make the keyboard (e.g., casting, injection molding, forming, etc.) what are the process parameters and the rate of production of the process.

The next stage, after a prototype of the part has been made, is revising the design. The above steps of part, tool and process design are repeated until a satisfactory part is produced, both as to design and cost of production.

Traditionally, each of the above steps are carried out sequentially, usually by different people. One person may design the part, another the tool, and a third the process. Collaboration between these designers is usually minimal. Where many revisions have to be made, numerous iterations are needed and a long period of time passes until a satisfactory part is produced.

Using present design approaches and tools, there is incomplete knowledge of the required manufacturing steps to produce the part, and inadequate consideration of the variety of other downstream influences that shape time to market, marketplace acceptance, and product longevity. Often neglected, but of importance in part design are the constraints added by environmental concerns relative to the product and its process of fabrication. These flaws lead to a multitude of costly and time consuming design reworks or difficult process modifications as unanticipated problems must be rectified.

Computer tools exist to help each designer carry out his or her function in the design process. For example, Computer-Aided Drafting (CAD) tools exist for creating two and three-dimensional drawings of the part. Material properties databases exist to help determine the composition of the part. CAD/CAM (computer-aided drafting/computer-aided manufacturing) tools exist that assist in tool design. Various tools exist for process design, for example, mould filling tools can be used in designing a mould injection process and simulations can be used in designing a sheet metal cutting and forming process. However, there is very limited interaction between the tools used at each step in the design process.

Existing tools may be useful in evaluating given designs. But they are unable to perform concurrent integrated design of part, tool and process. In effect, they automate the traditional sequential approach to design. For example, consider the field of plastic molding. Computer based tools now available to the molded part designer (e.g., mold filing tools, part cooling tools, shrink-warp predictions programs, structural FEM, even CAD/CAM systems) analyze the part as a whole. They attempt to predict part characteristics given full descriptions of geometry and process conditions. However, such tools can only be used in analysis functions; they do not synthesize new forms that achieve the functionality dictated by product use requirements. At best, a well integrated set of analysis tools may ultimately serve as a "virtual prototyping" environment, where leading candidates among various design concepts can be evaluated. However, unless rapid trial and error is offered as methodology for design, there remains a void to be filled at the conceptual design stage. The designer needs guidance to ensure that all design alternatives, from the outset, incorporate good engineering practice from the standpoint of all disciplines that contribute to the product lifecycle.

The way existing design tools represent information and communicate with each other is often not consistent. Moreover, the design tools used at the stages of part design, tool design and process design do not, because of the different representations used by these tools, communicate well with each other.

For example, CAD application programs create views of objects in two or three dimensions, presenting the object as a wire-frame "skeleton" or sometimes as a more substantial model with shaded surfaces. Some CAD programs can also rotate or resize models, show interior views, and generate simple lists of materials required for construction.

The drawings output by CAD systems do not comprise engineering knowledge. CAD systems are used to produce detailed engineering drawings when part geometry is known both qualitatively and quantitatively—i.e., after conceptual design is complete. Further, CAD systems generate the part geometry data used by subsequent analysis software to simulate part performance. But the part designer is not assisted in what to do to design a part that meets all performance requirements, including cost and manufacturability. It is as the design for the part is formulated that guidance is needed to ensure that all design alternatives incorporate good engineering practice from the standpoint of each contributing discipline: i.e., materials, part geometry, tooling, process and cost analysis.

CAD/CAM application programs can be used in both the design and manufacture of a product. With CAD/CAM, a product, such as a machine part, is designed with a CAD program, and the finished design is translated into a set of instructions that can be transmitted to and used by the machines dedicated to fabrication, assembly, and process control.

CAD and CAD/CAM systems are limited to address only the form of the design; functional requirements are the responsibility of the designer, not the system.

The knowledge used and needed when the part, tool and process are being designed typically has been represented in different ways. The notations for the part design, tool design and process design usually differ and are often not compatible. For example, when using a CAD system to design a part, knowledge of the process to make the part (for example, knowledge about die casting a metal part or about the flow of plastic) is not reflected in the part design in the CAD system. Thus, the design of a part may, although geometrically correct, not be a satisfactory design when considering the process used to make the part.

Further, the representation of the part in the CAD system uses geometrical primitives that are not useful for tool and process design. The geometrical primitives in a CAD system are usually points and lines, not geometrical shapes that are engineering concepts representing the components of a part. For example, a CAD drawing for a box is effectively one shape (the box) comprising lines, and not made from the engineering components that make up the box such as the base and side walls.

If the computer is to assist in the act of design, then it must reason about the part of a level of abstraction that is close to that of the designer. Today's software is designed to create geometry, but form is an ambiguous indicator of the designer's intent. Many things look alike, but it is their end use or functionality that dictates the appropriate set of rules by which size and shape can be computed. The engineering constraints and design relationships for a load bearing wall are different from those of a non-loadbearing internal partition. Ribs used for stiffening a wall are subject to completely different considerations from those used to dissipate heat, and sizing a hole to accommodate a self-tapping screw differs from sizing one to allow passage for a wire harness. Yet in each of the preceding scenarios it would be difficult, if not impossible, to judge the purpose of the geometric construct solely by its form or placement in the part.

No existing system enables complete product representation, where the product representation includes part geometry and functional information about the part. To do this requires a higher level of design representation than the typical CAD-type geometric products provide. Feature-based modeling techniques that have been proposed as a modeling technique have limitations. First, the designer is restricted to a finite number of pro-defined geometric shapes, and this may not be sufficient to capture the complete behavior of the part in terms of its functionalities. Another drawback is the difficulty in decomposing complex designs into a basic feature vocabulary. These shortcomings make it difficult for an intelligent design system to completely model a part and its function, and properly reason about the designer's intent. A new type of feature representation is required to address these limitations.

Automated processes are known for certain elements of the design process, but these are of limited application. For example, Flexible Computer Integrated Manufacturing (FCIM) is a known automated approach to produce a variety of parts for a given automated system. Quality Functional Deployment (QFD) is a known process that is used to help determine functional requirements from customer needs. Many attempts have been made to develop intelligent design systems using different implementations strategies. One implementation method is to integrate a commercial CAD system with an expert system inference engine. Some have attempted to integrate an expert system shell with a solid modeler. Another known approach is to use an existing knowledge-based engineering tool which already provides geometric modeling capabilities and mechanisms for embedding heuristic knowledge in the form of rules and methods. Systems developed using the above mentioned approaches have shortcomings due to the limitations of the commercial software packages which they are built around. None of these known tools or processes fully integrate part, tool and process design. Further, no known system represents all the knowledge for part, tool and process design in a systematic way so that this knowledge can be used in all stages of the design process.

Current computer-based tools require complete description of the part geometry as well as all relevant boundary conditions on the state variables of the system (for example, loads and constraints for stress, molding temperatures and gate pressure or flow rate for filing). A computer simulation may then predict the response of the part to this imposed environment. With sufficient accuracy in the underlying material response relationships (e.g. modules, density, viscosity) these tools could be viewed as an element of prototyping. If the process begins with molding simulation, and then the part dimensions are corrected for shrink and warp, as well as the anisotropic distribution of properties arising from flow orientation effects and if transverse morphological variations are fed into the structural analysis, the resulting deflections under load and stress patterns could provide rapid confirmation of the design and the means for design optimization. Such a strategy, however, fails to provide for a basic need critical to the rapid evolution of design concepts into detailed designs; the initial specification of geometry and process conditions that are suitable to meet the design requirements.

Present design practices are illustrated in FIG. 1 (prior art), which shows the sequential nature of the design and fabrication steps. The functional elements of part, tool, and process are handled in a serial fashion that necessitates considerable prototyping to ensure consistency of the final part with the designer's expectations. The role of computing aides and tools, as discussed above, only support the individual functional domains, and do little to bring downstream influences up to higher design levels.

As shown in FIG. 1, the first step of the typical prior art methods is to determine customer requirements (step 2). Once a product concept is decided upon, a preliminary design of the past is made (step 4). Usually, a sketch is made of the proposed part. If the sketch is approved (step 6), a detailed part design can be developed (step 8). A CAD system 28, a database system 30 and a Finite Element Method (FEM) 32 can be used to produce a detailed part drawing. If this drawing is approved (step 10), a prototype tool design is developed (step 12). A CAD system and a mold-filling analysis (MF) 34 can be used to produce a detailed tool drawing. A CAM tool 36 is used at the tool fabrication step (step 14). Next, the process specification is decided upon (step 16), often with the aid of a MF. Actual manufacturing trials are carried out (step 18), and if approved (step 20), a product tool design step (step 22), a tool fabrication step (step 24) and product manufacturing (step 26) are carried out. One should note the sequential nature of the prior art design process, and the many revisions and tests that must be undertaken along the way to obtaining correct and feasible part, tool and process designs.

Typically, at steps 4 and 8, parts are conceived for form and function only, and designed with the assumption of uniformly distributed properties. For example, when designing parts that will be created using injection molding techniques, modifications like draft angle and corner radii are left as afterthoughts for the tooling engineer (at steps 12 and 14), and the ramifications of flow orientation and transverse morphology that result from the processing step (step 16) are rarely considered, if at all. The price paid is one of over-design to allow adequate safety margins, excessive rework of part, tooling or process to accommodate unanticipated interactions, and even outright elimination of plastics as candidate materials of construction. In any event, the result translates to dollars wasted in materials and resources, and profits lost in delayed time to market.

SUMMARY OF THE INVENTION

The present invention is directed to a computer-based method and apparatus for the concurrent design of a part, the tool to make the part, and the processes used in making the part. According to the present invention, unlike prior art systems, the part design, the tool design and the process design are carried out concurrently. As used herein, the term "integrated design" and "integrated design phase" refers to a single design phase in which part, tool and process are designed concurrently. A part is made from a number of sub-parts (also called "features"). A product is an assembly of one or more parts.

Utilizing all available forms of information—data, algorithms, and heuristics—the present invention works to produce, concurrently, detailed part geometry, as well as preliminary tool design and processing recommendations. As an ancillary benefit, the underlying part description serves to directly feed all existing forms of computer based analyses as well as production control systems.

The method of the present invention initially begins at the start of the manufacturing "food chain", piece part design. Without good part design, sub-assemblies cannot be reliably designed, and without reliable subassemblies, defective product designs will abound.

To enable correct part design, the present invention provides the part designer with all relevant information effecting the part design (such as, for example, information about the processes and materials used to make the part) while the part is being designed. Further, the tool designer and the process designer are also provided with all relevant information effecting their designs. According to the present invention, the information supplied to the part designer, the tool designer and the process designer is the same "model" of relevant information. This model of information can be shared concurrently by each designer. Design decisions made by each designer can be included as a factor in the design decisions by other designers. As such, the functions of part designer, tool designer and process designer often merge and overlap when the present invention is utilized.

The representative embodiment of the present invention comprises five modules, namely, a material selector module, an engineering economics estimator module, a core design module (that performs the integrated design phase), a tooling generator and a tool fabrication process planner module.

Once the customer requirements for the new product are ascertained and a preliminary design concept has been determined, the present invention is first used to help decide appropriate materials and production economics criteria.

The material selector module determines a list of material properties and associated threshold values that are critical for success in the design of the product. The material selector module may be regarded as an expert system comprising, or having access to, part, tool and process knowledge. The material selector module of the present invention utilizes "end-use knowledge". The material selector module categorizes parts by the end-use application for the part and the end-user environment in which the part is to be used. For example, if the part is to be used as a gear in a pump for a cement plant, the materials selector module will, inter alia, determine the set of properties that such a gear should have: e.g., the temperature levels at which the gear can operate, solvent resistance properties, etc. The materials selector module can also determine aesthetic requirements. Further, the materials selector module can determine, based on the function of the part, that certain factors are not important, e.g., the external appearance of a gear.

Thus, according to the representative embodiment of the present invention, material selection and production economics are initiated as soon as there is a preliminary design concept. Accordingly, the material selector module uses the knowledge contained in the nature of the end-use application (what kind of part is it), in conjunction with its operating environment (where will the part perform) to define the short list of material properties and associated threshold values that are critical for success. For example, when deciding upon an electronics enclosure for automotive under-hood environments, the material selector module automatically specifies thermal and chemical resistance constraints, electrical properties, impact considerations typical of use and abuse, cost, even basic size parameters.

These requirements can be used to formulate database queries to any of a number of remote data servers to generate a ranked list of suitable materials—including "generic" materials that represent the lumped average of competitive commercial grades. As is known it the art, databases exist that comprise lists of materials and their properties, such as, for example, the on-line databases operated by the General Electric Corporation, and D & S Data Resources Inc. (of Yardley, Pa.) both which contain material properties information. These databases can be accessed via a modem connection by the material selector module of the present invention.

The engineering economics estimator module of the present invention can be used to estimate the overall cost of producing the product. By taking the economics of product design and production into account at an early stage, decisions and constraints can be determined before detailed designs are made. This prevents designs being made or prototyped that are economically infeasible.

The engineering economics estimator module provides the resources to trade-off various approaches in tool design and machine configuration, manufacturing locale and choice of vendor against production requirements to arrive at optimal choices. According to the representative embodiment of the present invention, the processes carried out by the engineering economics module can work with minimal information about the part—even less information than that which is often contained in a preliminary design sketch. As is known in the art, indices of part complexity, bounding size information, and product application/environment information used for material selection, have been reduced to statistical correlations that provide tool cost estimates that are accurate to within current industry standards. This enables economic decisions to be made in advance of initial design steps. This also allows the part design activity to begin with information such as, for example, knowledge of material selection, machine size and number of parts to produce per machine cycle, and production rate, all of which influence part design decisions.

The core design module of the representative embodiment of the present invention operates on the principal that form follows function. The core design module concurrently designs part, tool and process. The core design module can utilize the information produced by the material selector module and the engineering economics estimator module to generate a more feasible design.

In prior art systems, the part design phase requires part knowledge, the tool design phase requires tool knowledge, and the process design phase requires process knowledge, all of which are usually stored separately and represented in using differing notations. Further, as discussed above with reference to FIG. 1, each of these bodies of knowledge ares used at a different stage of the process (e.g., part knowledge is used at step 8 of FIG. 1 and tool knowledge is used at step 12 of FIG. 1). As the core design module enables concurrent design to take place, the core design module requires part, tool and process knowledge to be represented differently from past representations. This novel representation categorizes design information by functional geometry and includes information that can be used to infer design parameters from known design information. In the representative embodiment of the present invention, design information is stored as a frame-based representation. In general terms, each frame (also called a feature template or a frame of feature information) can include part information (such as geometric attributes), tool information and process information. Thus, for example, processes knowledge (e.g., information about the flow of plastics), which is needed when designing a part, can be used at during part design.

For example, one frame comprises information about one geometric primitive, such as, for example, a "box" construct. This frame is indexed by function, e.g., "enclosure". Thus, geometric attributes are associated with the function-form pairs in a straightforward way (e.g., enclosure-box). The frame comprises information relating to design of the box, design of the tool to make the box (e.g., mould information), and design of the process to make box (e.g., injection molding information). Further, the frame can also comprise engineering information to complete a design if only certain information is known.

Feature information included in a frame may comprise a combination of generic forms and design functionalities. A feature has attributes that describe its characteristics and behavior. These attributes can include geometric (i.e. height, thickness) and non-geometric (material type, yield stress) information. The attributes, along with a geometric definition of the feature, are included in the frame of feature information.

Each feature of the part design, and the corresponding tool and process design, is represented in the frame of feature information. In the representative embodiment of the present invention, each frame is implemented as an object-oriented structure that includes name of the feature, object constructor, geometric forms, function list, attributes, parametric relationships and engineering rules represented as equality and inequality constraints. A frame represents a generic feature or feature family that can be used during product design.

As the present invention represents knowledge about a part, the tool to make the part, and the process used in making the part in frames of feature information, the present invention has the ability to reason and to enable automation of the transition from design to other aspects of product development. For example, a frame of feature information can be used to automate model preparation for engineering analysis and to automate some aspects of manufacturing, such as, for example, process planning, material removal and tolerancing.

As another example, a frame may have a rule that takes into account location specific information. Thus, if the design of a box includes a corner, the system may have a rule that will round all outside corners.

In most cases, a complete geometric definition of the feature is not required for reasoning and rule checking. The types of information required for reasoning purposes are those attributes that are relevant to knowledge processing activity. In addition to geometric attributes, a feature may have reasoning attributes that are derived based on the intended functions of the features. Depending on the application, reasoning attributes may or may not be the same as geometric attributes. However, in most cases, the reasoning attributes are a subset of geometric parameters of the geometric attributes. Therefore, a dual representation is an effective mechanism which enables modeling of complex geometric shapes not limiting the user to standard forms and attributes.

A product design (or model) according the present invention can be comprised of part functionalities, feature definition, relationships among features, specifications and knowledge about part design (together called "feature objects"). Within a product model, relationships are represented by a directed graph structure based on dependencies between the feature objects. This structure model supports the concept of inheritance and associativity. Such a representation of product design is beneficial in an intelligent design system, as it allows the relationships between various features to be easily defined and examined.

Accordingly, the frame-based representation of knowledge utilized by the present invention can capture both form and function of a feature, enabling implementation of a complete product definition. For example, a traditional CAD system may describe a hole in a part, but give no indication of the purpose of the hole. The function of the hole has an effect on the design. A hole used for ventilation has different design requirements than a hole used for insertion of a screw. The frame-based representation of the present invention can provide and store knowledge as the desired function of the hole.

Engineering rules are written as parametric relationships and constraints. The rules can set the value of an attribute to a constant, compute the value based on other attributes, demand inputs, set the value conditionally or look up values from on-line catalogs and databases. The rules can also call external procedures to perform complex engineering calculations such as structural analysis using analytical methods.

Typically, the core design module can be used by a part designer. When designing the part, tool knowledge and process knowledge are used to influence part design. Further, as the part is designed, the core design module concurrently designs the tool and the process.

The core design module uses pre-parameterized geometric elements that are organized under their end-use functionality in the part. Thus, the core design module facilitates rapid definition of the part geometry, as an "assembly" operation in contrast to the "drawing" operation typical of CAD systems. Because the functional organization of geometry determines the context for engineering decisions necessary to meet the performance requirements, complex inference schemes are unnecessary. Furthermore, engineering algorithms allow for definition of geometric parameters to complete the design, in contrast to simulation-based approaches that require full definition of geometry.

For example, an enclosure (function) using a box construct (form) would require the user to specify the bounding prism (attributes of length, width, and height), but the part thickness would be computed based on the mutual satisfaction of design equations for maximum deflection and stress under load, cooling time constraints, and filing pressure requirements to fill before freeze off. These calculations draw upon information contained in the preliminary tool design and process specification. For example, in the field of injection molding, the calculations used in deflection calculations of side walls or base wall of the box may depend on the flow orientations that in turn are dependent upon gate location (an attribute of the melt feed functionality of the tool), as well as the cooling rates that prevail by contrasting the convective and conductive heat transport processes in the tool (mold filling and mold cooling functionalities of the process, respectively). Furthermore, the modules (as well as other material properties) may depend upon the effect of the selected injection machine and process parameters as they alter the characteristics of the raw feed material. In addition, parametric studies conducted by numerical analysis provide the additional modification to the base equations to reflect more complex interactions of the part.

When using the core design module of the present invention, tooling elements that "touch" (or have an effect on) the material or constrain its behavior such as, for example, (in injection molding), parting line gate and ejector pin location, can be considered and taken into account when designing the part. As another example, in injection molding, process elements that alter the feed material characteristics or influence the melt flow characteristics such as, for example plasticating rate, injection rate, and coolant flow can also be considered at the part design stage. These elements, in turn may set the constraints for subsequent decisions as tool and process are designed. For example, the envelope of part dimensions constrains the overall tool dimensions, which in turn, dictate the minimum machine size necessary to accommodate the tool. As another example, in injection molding of plastics, the part volume dictates the shot size and plasticating ratio, both of which constrain lower and upper limits on the machine size, as well as dictating operating conditions.

In the representative embodiment, the core design module uses process characteristic times to represent process functionalities, such as part cooling, cavity filling or feed plasticating, in the frame. The characteristic times combine process conditions, tool geometry and material parameters to form yardstick measures for the underlying transport phenomena that shape system characteristics.

As the present invention uses concurrent design techniques, this ensures that no one design phase ends up over-constrained by earlier decisions made in ignorance of their ramifications in the other related design phases.

The tooling generator of the present invention takes as input the detailed part drawings produced by the core design module and produces a prototype tool. The tooling generator of the present invention is an example of the improvement in downstream operations that are facilitated by the integrated part, tool, and process specification arising from the approach of the present invention.

For example, in the injection molding field, the dynamic evolution of core and cavity surfaces that occur automatically during the part design process leads to the data necessary for sterolithographic machines to create masters images that, when metallized lead to prototype tooling. When the detailed tool design is built around the preliminary structure from the part designer, the feature level tool description contains the associated machining operations.

The tool fabrication process planner module uses the frame-based representation of the present invention to produce instructions to people or machines for the creation or assembly of a tool. By using the form/function parts of the present invention to describe tool and its manufacture, time to market is reduced in the production of tools. It is the natural extension of the concurrent part design methodology whereby the tool and its fabrication process are handled concurrently.

The present invention can suggest alternatives in the design process. The present invention facilitates the selection of proper design approaches. For example, if the user requires a join, the present invention lists possible choices, e.g., screws, clips, nails, etc., and if given enough information, may suggest a preferred approach. Further, taking other design information into account, once the desired join is selected, the system can make further design suggestions. Thus, if the user selects a screw, the system can inform the user of a preferred height and outer diameter of the screw based upon the systems knowledge of the size of the boss. If the user then instead selects a self-tapping screw, the system will notify the user that the dimensions of the boss may have to be increased.

The knowledge representation scheme of the present invention enables engineering economics to be given to a user. For example, once the part, tool and process design have been established, the system can access on-line databases or stored information to determine the cost producing the part in different geographic areas, the cost of producing two parts per mould compared with three parts per mould, and which machines are needed to produce the part and the cost of such machines. Thus, it can be determined if it is feasible to produce the part within budget. The system can inform the user of breakdown of its estimated production cost (e.g., inform the user that the material cost is the greatest cost) to enable the user to redesign the part, tool or process so that budgets are met.

BRIEF DESCRIPTION OF THE DRAWINGS

FIGS. 2A and 2B together are a diagrammatic representation of an example feature template.

DETAILED DESCRIPTION

Figure 2:
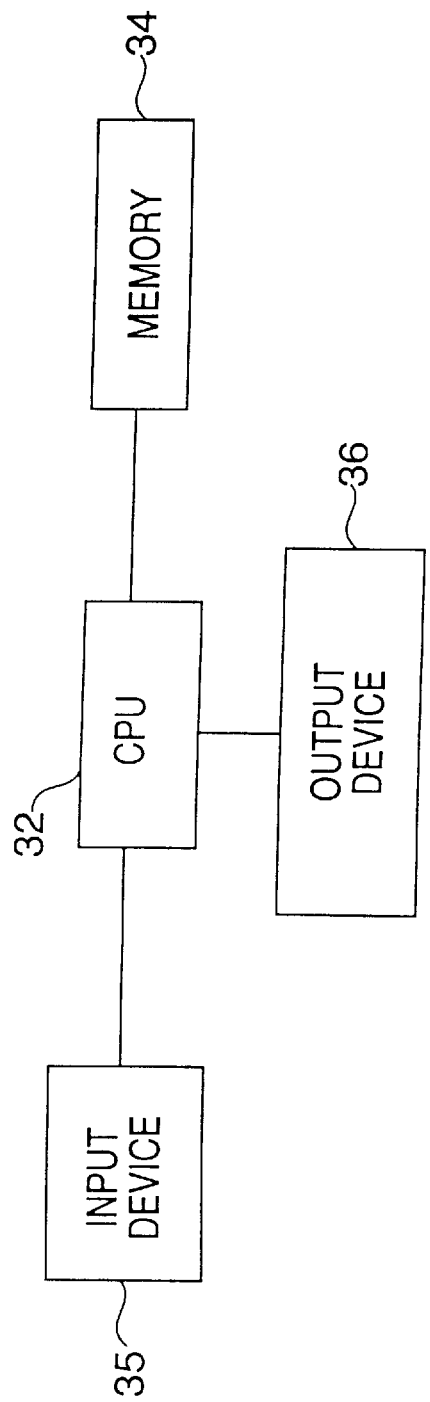
FIG. 2 is a block diagram illustrating the hardware used in the operation of the present invention.

Referring now to the drawings, and initially FIG. 2, there is illustrated in block diagram form the hardware used to operate the representative embodiment of the present invention. A central processing unit ("CPU") 32 is coupled to a memory device 34, an input device 35 and an output device 36. The CPU 32 can be, for example, a personal computer such as a UNIX brand workstation, an IBM compatible personal computer, an Apple MACINTOSH computer or a SUN brand workstation. The input device 35 can be, for example, a keyboard, mouse, voice recognition unit, or any other device capable of receiving instructions. The input device 35 may be a link to another computer system, for example, for receiving instructions over a network. The output device 36 can be any device that is capable of displaying or presenting data and/or diagrams to a user. For example, the output device 36 may be a computer monitor. In the representative embodiment, the output device 36 can output information and diagrams concerning part geometry, draw direction, material specification and machine specification. The memory 34 may be secondary memory, such as a disk drive, or primary memory, such as RAM, or a combination of both.

The modules of the present invention are implemented in software, but can, if required be implemented in hardware or a combination of hardware and software. The modules are stored on in the memory 34 and are executed by the CPU 32. The user interface of the present invention enables intelligent "conversations" to take place between the modules and the user via the input device 34 and the output device 36.

In the representative embodiment, the present invention is implemented in the "C++" programming language and uses Pro-Engineer from Parametric Technology Inc. as its solid modeling and front-end CAD system. The present invention is implemented using object-oriented programming techniques.

The data structures of the present invention are stored in the memory 34. In the representative embodiment, the data structures that represent part knowledge, tool knowledge, process knowledge and material knowledge are templates (also known as frames).

The template scheme provides a uniform data handling mechanism that spans the domain of part, tooling, process and material. The templates of the present invention allow the collection, under a single header, of various types of information: fixed parameters (e.g., user supplied data), parameters derived by relationship with other parameters from the same template (e.g., a boss' outer diameter computed from the value of its own inner diameter), parameters derived by relationship with parameters from other templates in the same domain (e.g., a boss' height computed from the thickness of the wall to which it is attached), and parameters derived by relationship with parameters from other templates in other domains (e.g., a boss' draft angle computed from the tool orientation relative to the boss). The relationships may be, for example, algebraic expressions, logical expressions or functions that return a value by means of any data handling procedure encoded in a computer programming language.

As used herein, the templates of the present invention are called "feature templates". Usually, each feature template comprises four domain templates, namely, a part-feature template, a process-feature template, a material-feature template and a tool-feature template.

The templates of the present invention are organized in a hierarchical structure. Thus, feature templates can be combined to create macro-feature templates. Accordingly, the template scheme of the present invention allows a hierarchical set of representations that build upon a simple set of function-form primitives to yield successively more complex design elements. For example, an "attach::gusset-reinforce_boss" structure can be defined by reference to an existing boss template and an existing gusset template without the need to re-specify the underlying data structures. In turn, a "mount::corner_boss" construct could be defined as four "attach::boss" templates, located at the corners of a planar quadrilateral. These compound templates are called macro-feature templates—they are created by inclusion of the defining elements or data structures of previously defined features.

A feature template is a representation of a primitive object which has a form and a function. An example of a feature template is a "support::tapered wall" feature template, wherein the primitive object is a tapered wall and the function of the tapered wall is support. Another example is a "support::rib" feature template that represents a type of projection known as a rib, where the rib has a support function. A tapered wall and a rib can be regarded as sub-parts that can be used to make a part.

Each feature template also includes information about the geometric form of the primitive object. The form information provides a representation of a parameterized primitive geometric entity having the form of the primitive object. Examples of primitive geometric entities include a trapezoidal prism, a rectangular prism, a cylinder closed one end and a circular plate. Thus, a feature template includes form information that represents a parameterized primitive geometric entity having the form of the primitive object of the feature template.

Feature templates describe procedures and geometric forms along with user defined parameters and constraint relationships. The constraints represent rules associated with the feature. The present invention enables a design to create an instance of a feature according to a feature template in run-time.

Each feature template is indexed by the function of the primitive object that the feature template represents (e.g., support, fasten, etc.). Additionally, each feature template can also be indexed by the primitive object (e.g., wall, prism, etc.). Each feature template can be uniquely defined by its primitive object/function pair (e.g., support::rib).

Each feature template also may include other information relating to the primitive object. For example, a feature template may include information about the tools and the processes to make the primitive object and the material(s) from which the primitive object is made. The tool information, the process information and the material information can also be stored in templates.

Figure 2B:
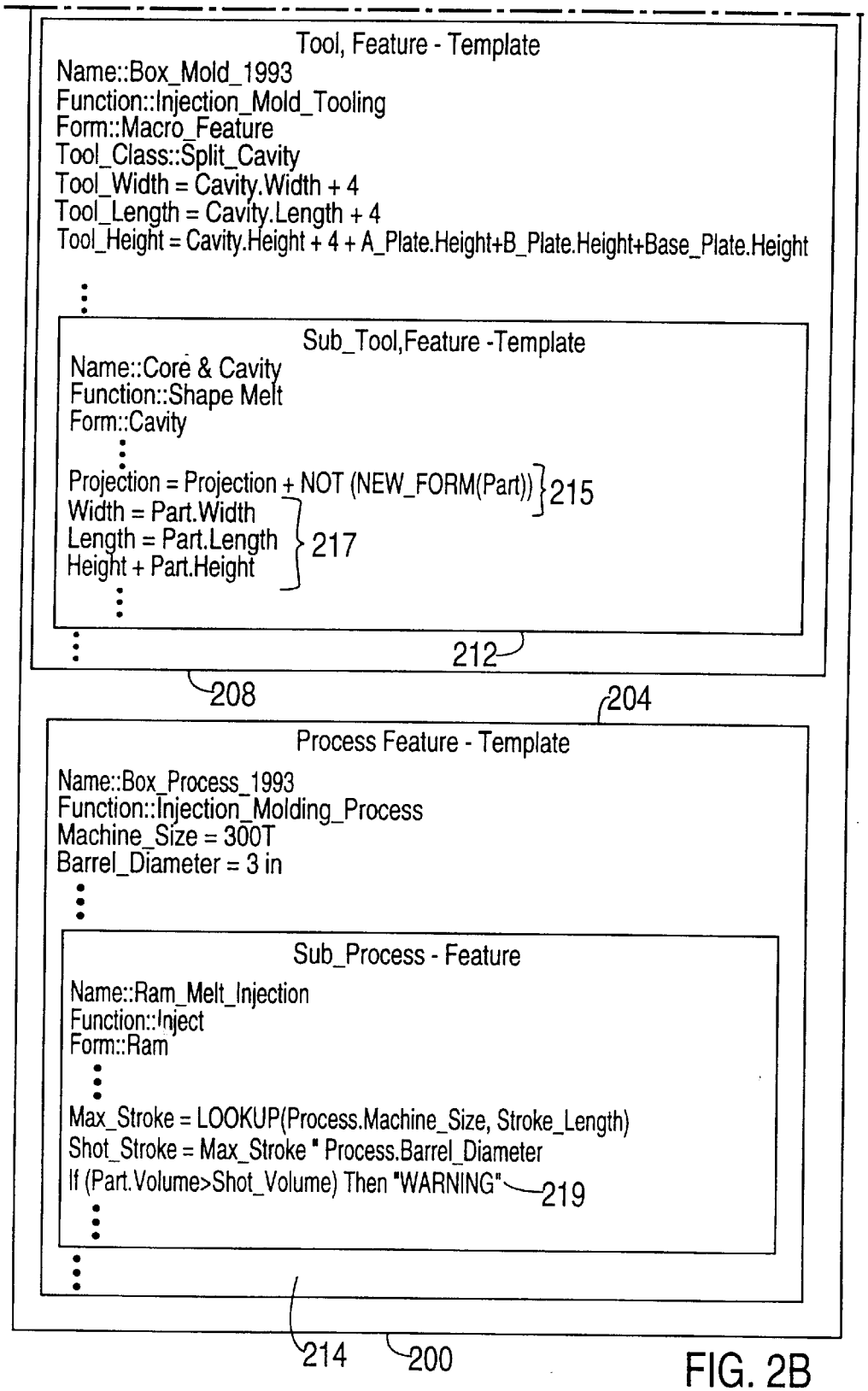

Referring now to FIGS. 2A and 2B, there is illustrated an exemplary feature template 200. The feature template 200 comprises four templates, namely, a part-feature template 202, a process-feature template 204, a material-feature template 206 and a tool-feature template 208. The feature template 200 can be regarded as being a master template with pointers 201 to domain specific templates (e.g., 202, 204, 206 and 208). In the example of FIGS. 2A and 2B, the feature template represents a plastic molded box that is made using injection molding.

The part-feature template 202 represents a box. The function of the box is an electrical enclosure. Part-feature template incorporate sub-part feature templates that represent the sub-parts that are used to make the part represented by the part-feature template. For example, a "Boss_1" sub-part feature template 203 is shown that represents a boss that has an attach function. (Other sub-parts are used to make the box represented by part-feature template 202, but are not shown in FIGS. 2A and 2B.)

The part-feature template 202 includes part information. The part information may include information about the form of the part (e.g., its shape and dimensions) and other relevant information, such as, for example, the volume of the part and the cost of the material to make the part. As shown in FIG. 2A, the part-feature template includes a volume formula. To evaluate this formula, the template accesses all the sub-part templates to determine the volume of the sub-parts, and then sums these volumes. To evaluate the material cost formula, the template accesses the material-feature template 206 to obtain material price information.

The sub-part feature template 203 represents a boss. To obtain the orientation vector 205 for the boss, the template dynamically accesses the wall sub-part feature template (not shown). Geometric parameters of the adjoining wall are also used to compute hole depth and base radius geometric parameters of the boss (see 209). In this example, a default setting is that the boss is constructed perpendicular to the wall. The boss thickness 207 is computed (rather than specified by a user) by manually satisfying several performance constraints. Material properties from the material-feature template 206 are used to evaluate these constraint relationships. Geometric parameters from the tool-feature template 208 are used to compute the draft angle of the boss, using a conditional assignment function (see 211).

The material-feature template 206 can also include sub-material templates. In this example, the material-feature template 206 includes a "Youngs Modulus" sub-material feature template 210 that has a "lookup" function 213. The material parameter "modulus" reflects the influence of the injection process as captured in a lookup table correlating machine size effects on property degradation.

The tool-feature template 208 can also include sub-tool templates. In this example, the tool-feature template 208 includes a "core and cavity" sub-tool feature template 212. The sub-tool feature template 212 has a melt shaping function 215. The details of the cavity projection in the injection mold tooling are formed by a solids-modeling operation to remove the volume occupied by molten polymer for the cavity block, using values of the geometric parameters of the newly instantiated boss. Further, the maximum dimensions of the cavity block feature are deduced from the part feature dimensions (see 217).

The process-feature template 204 can also include sub-feature templates. In this example, the process-feature template 204 includes a "ram_melt_injection" sub-process feature template 214. The sub-process feature template 214 has a function 219 in which the part feature's volume is compared against the process feature capability to warn the user of design inconsistences.

The feature-template 200 itself may be included as a part of another feature template, making, in effect, the feature template 200 a sub-part feature template. Further, the feature-template 200 can include form and function information fields that comprise information about the feature as a whole.

The present invention enables a designer to create feature templates and store them in a feature template library.

A primitive object can have a number of functions. For example, a rib may have a support function and/or a flow-leader function. A tapered wall may have a support function and/or a shield/access function. As stated above, each feature template is indexed by the function of the primitive object.

The following table (Table 1) identifies examples of feature templates:

TABLE 1

| Feature (primitive object) | Form (primitive geometric entity) | Function |
|---|---|---|
| Feature class - wall | | |
| Uniform thickness | Rectangular Prism | Support Shield/ Access |
| Tapered | Trapezoidal Prism | Support Shield/ Access |
| Stepped | Assembly of Walls | Support |
| Triangular | Triangular Prism | Support Shield/ Access |
| Curved | Segment of Cylindrical Shell | Support Shield/ Access |
| Flat Disk | Circular Plate | Support Shield/ Access |
| Housing | | |
| Box | 5-Sided Rectangular Box | Support Shield/ Access |
| Round | Cylinder closed one end | Support Shield/ Access |
| Dome | Hemisphere | Support Shield/ Access |
| Projection | | |
| Rib | Rectangular Prism | Support Flow-Leader |
| Gusset | Triangular Prism | Support Flow-Leader |
| post | Cylinder | support Locate |
| Boss | Hollow Cylinder | Fasten Support |
| Depression | | |
| Hole | Cylinder | Locate Support Shield/ Access |
| Groove | Rectangular Slot | Locate Support Shield/ Access |
| Assembly | | |
| Snap | Clip | Fasten |
| Hinge | Flexible Connection | Support Locate |
| Hole for molded-in-Insert | Cylinder | Fasten |
| Rectangular Flange | Rectangular Frame | Locate Support Shield/ Access |
| Circular Flange | Circular Ring | Locate Support Shield/ Access |
| Dog-Ear Flange | Dog-Ear | Locate Support Shield/ Access |
| Helical thread | Helix | Fasten |
| Join | | |
| Fillet | Concave Bead | Flow-Leader |

Accordingly, a "feature" can be regarded as being an instance of a primitive object created according to a feature template.

The present invention supports design at various design levels. For example, a feature template may, in the design process, represent a sub-part (such as a boss), or a part (such as a gear), or an assembly or subsystem (comprising a number of parts), or a product or system. For convenience, the term "part" is used, but this term is not limited to part, and includes sub-part, assembly, subsystem and product. Accordingly, a feature template may represent any object in the design process, for example, from a screw to a completed product.

Figure 3:
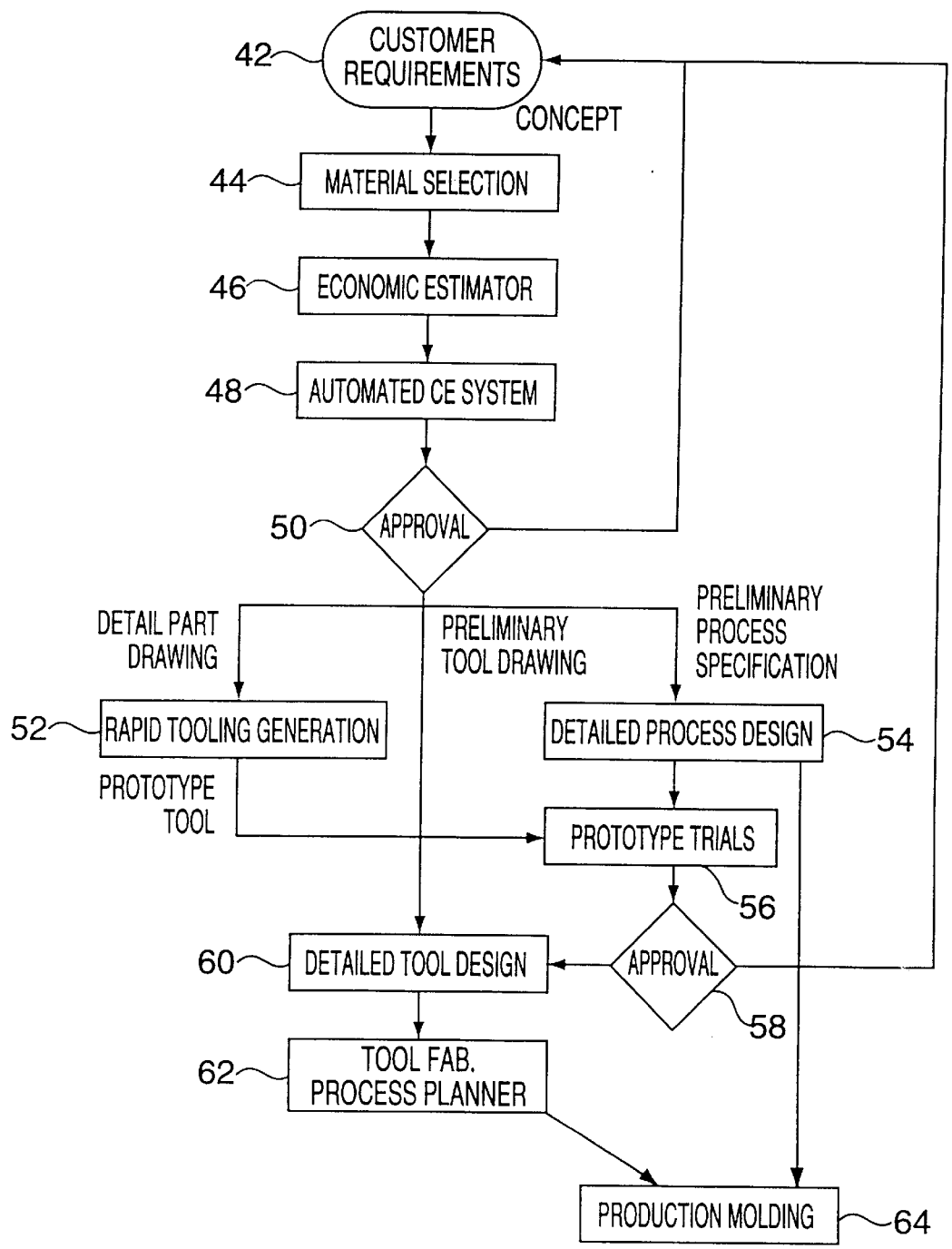
FIG. 3 is a flow chart describing the steps of the methodology of the present invention.

Referring now to FIG. 3, there is illustrated in flow chart form the overall steps of a representative embodiment of the present invention. The first step is to determine customer requirements (step 42). In the representative embodiment, customer requirements are specified in terms of constraint relationships. A constraint relationship can be, for example, an expression involving parameters and/or procedures of features. (Generally, as used herein, a procedure is an algorithm representing behavior.) Constraint relationships can exist at the product level, the part level and the sub-part level. According to the present invention, any entity must satisfy constraints specified at its level and all high levels. By way of example only, general injection molding requirements and design specific requirements can be expressed in terms of constraint relationships.

Next is the material selection step (step 44). In the representative embodiment, this step is carried out by a material selector module (72 of FIG. 4). The output of the material selector module 72 includes a list of material properties and associated threshold values for a part (or geometric primitive) that are critical for success. The material selection module 72 can provide its output in the template notation of the present invention.

The next step is that of economics estimation (step 46). In the representative embodiment, this step is carried out by an engineering economics estimator module (74 of FIG. 4). At the economics estimation step 46, various design approaches are presented to the user to enable the user to determine production requirements that economically feasible. The economics estimator module can work with minimal information about a part (typically, less than is usually contained in a preliminary design sketch) to arrive at optimal choices. In the field of injection molded plastics, examples of decisions made at step 46 include mold and machine configuration, manufacturing locale, vendor of raw materials, production rate etc. It is noted that if, at a later design phase, revisions to a design are made, then new economic estimations can be presented to the user. At any stage, the user can change the parameters decided at this step, and the present invention will automatically update cost estimates etc. that are effected by such changes.

After material selection and production economics have been decided, concurrent design of the part, tool and process takes place (step 48). In the representative embodiment, this step is carried out by a core design module (76 of FIG. 4). At step 48, a detailed part drawing, a preliminary tool drawing and a preliminary process specification are produced, concurrently.

If the detailed part drawing, the preliminary tool drawing and the preliminary process specification are approved (step 50), then the detailed part drawing and the preliminary tool drawing are used for tooling generation (step 52). A tooling generator produces a prototype tool design and a process planner uses this design to make a prototype tool. In the representative embodiment, this step is carried out by a tooling generator module (78 of FIG. 4). Accordingly, a prototype tool is produced.

The preliminary process specification is used by a process engineer to determine a detailed process design (step 54), as is known in the art. The prototype tool (produced at step 52) and the detailed process design (produced at step 54) are used in prototype trials of the part (step 56). If these trials meet with approval (step 58), then a detailed tool design is made (step 60). A tool fabrication process planner module (80 of FIG. 4) is used at step 62 to translate the detailed tool design into the associated machining operations. This, along with the detailed process design, is used in the process molding operation (step 64).

Figure 1:
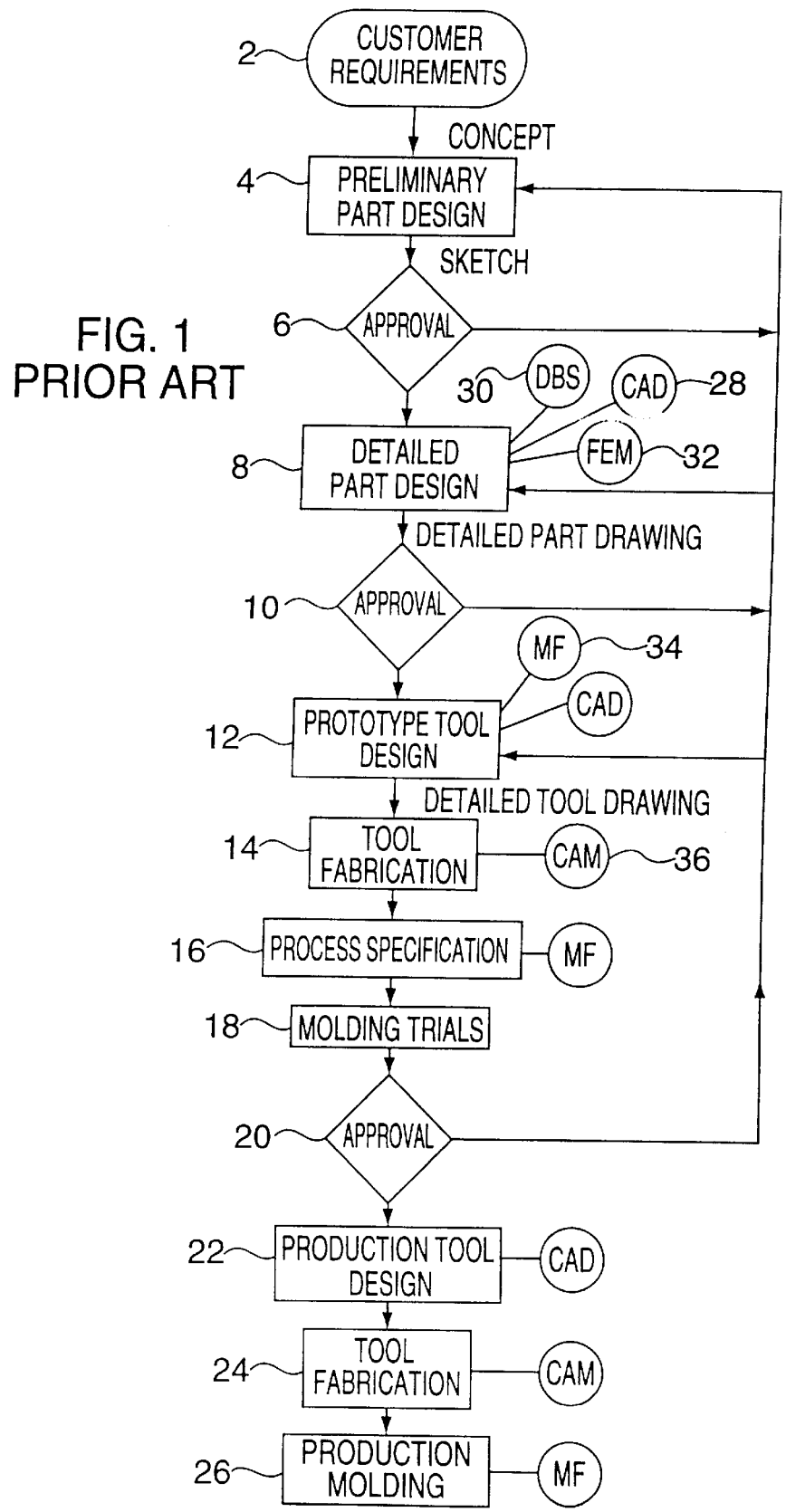
FIG. 1 is a flow chart describing the steps of prior art design methodologies.

It is noted that the steps of FIG. 3 can be modified to suit individual requirements. One should note that unlike the prior art methods (e.g. FIG. 1), the detailed part drawing, the preliminary tool drawing and the preliminary process specification are produced concurrently.

Figure 4:
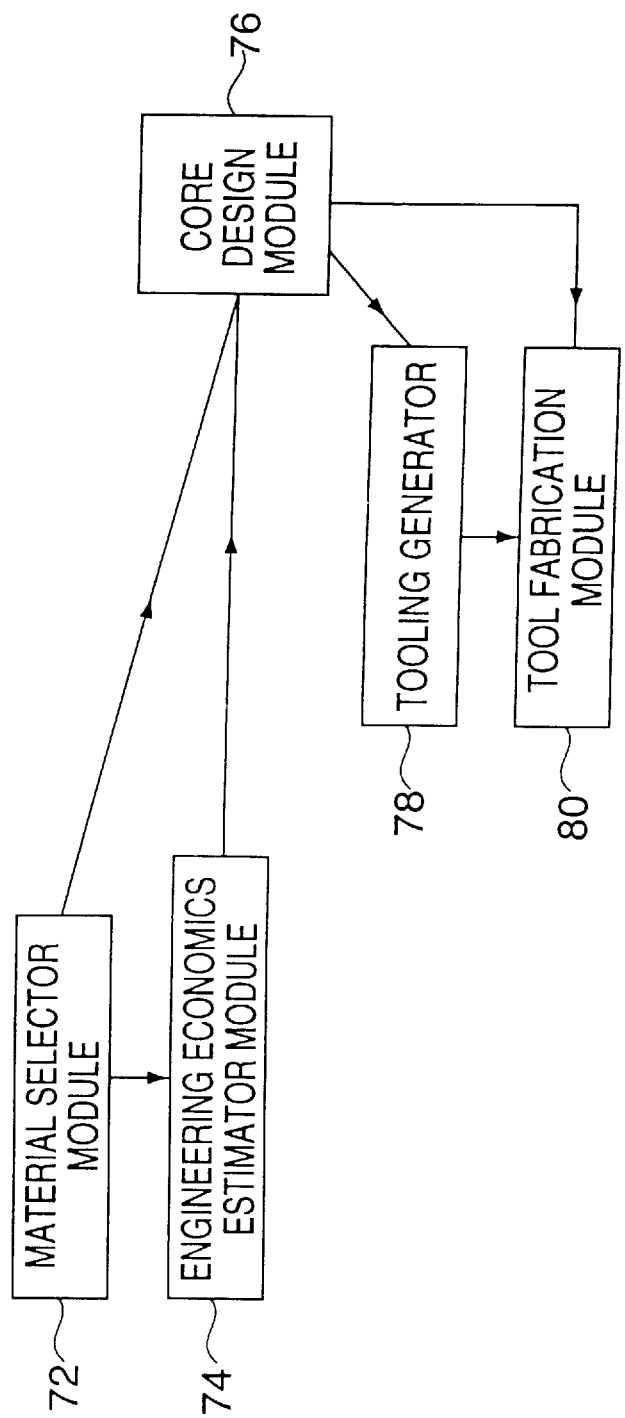
FIG. 4 is a block diagram of the modules of the present invention.

Turning now to FIG. 4, there is illustrated in block diagram form the modules of a representative embodiment of the present invention. There are five modules, namely, the material selector module 72, the engineering economics estimator module 74, the core design module 76, the tooling generator 78 and the tool fabrication process planner module 80.

The material selector module 72 generates an a priori choice of suitable material(s) for the product based upon product application and environment. The material selector module 72 draws upon a material properties database 90 for values and a product design library for the subset of critical properties and their default values based upon application and environment. The material selector module 72 interacts with the core design module 76 to continually scan and update a list of viable materials based upon updated data on part performance requirements.

The material properties database 90 supports multiple data representations for any given property. The database 90 supports an SQL interface to accomplish extensive pattern matching query operations, for example, return all resins with a glass transition temperature greater than 150 C. The material selector module 72 can generate a series of queries in the form of inequalities for specific property values.

The engineering economics estimator module 74 allows the designer to examine the overall part cost sensitivity to factors that include: material, part dimensions, tool fabrication cost, production lot size, processing cost etc. The engineering economics estimator module can be utilized both before and after part/tool geometry definition. During part creation, the engineering economics estimator module 74 can provide feedback of the total part cost, and the contributions to this cost due to material, tooling and processing. The material properties database 90 comprises material costs, and once the geometry of the part is determined, the cost of the materials can be calculated.

The engineering economics estimator module 74 also supports an interactive environment that allows the designer to examine the cost of a part at the different project phases. At a very early stage of design, an engineering economic model is used in such a way that the designer will know what area of the process (tool cost, material cost, processing cost, set-up cost and post-processing costs) is the largest contributor to part's overall cost. In latter stages of the design, the part cost can be broken down into sensitivity factors that include material type, part complexity, part dimensions, wall thickness, tolerancing etc. Lastly, once the design is settled and the tool is designed, a machine based cost model can be used.

The core design module 76 concurrently designs the part, tool and process. The core design module can utilize the information produced by the material selector module 72 and the engineering economics estimator module 74 to generate a more feasible design.

The core design module 76 can request functional knowledge from the user to for use in designing the part, tool and process concurrently. The core design module utilizes information about the function that the part performs during the design process. For example, if the user wishes to design a part that has a join, the user will interact with the core design module 76, for example, by inputting that the user wishes to include a join in the design. The core design module 76 will present the user with a list of possible options that fulfil the user's requirements. The user can then select one of the options (e.g., a type of join) that the core design module 76 suggests.

Figure 5:
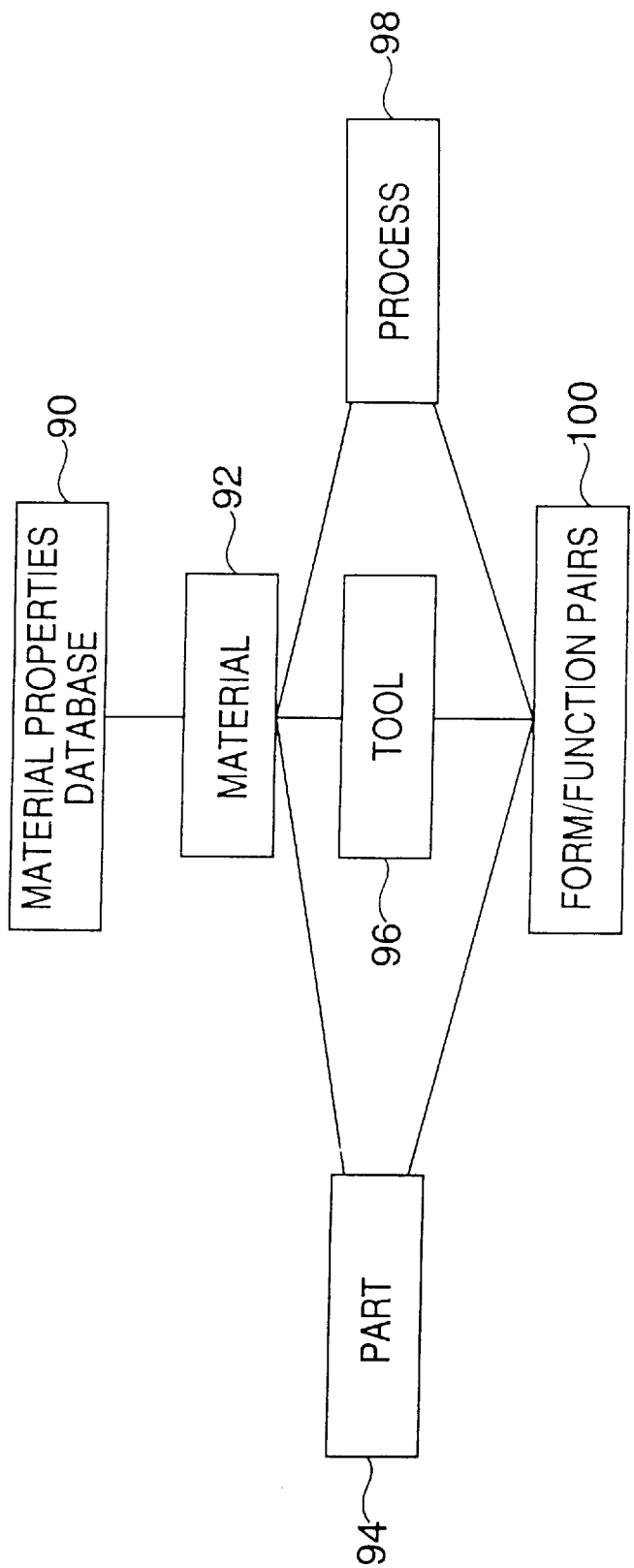
FIG. 5 illustrates in block diagram form a feature template data structure used by the core design module of FIG. 4.

The core design module 76 uses a frame-based approach to represent knowledge. FIG. 5 illustrates in block diagram form a feature template data structure used by the core design module 76. Each feature template 100 stores information as form/function pairs. The form/function pairs comprise knowledge about various geometric primitives, organized by function. Each feature template 100 includes knowledge about parts 94, tools 96 and processes 98.

The core design module 76 also utilizes material information 92 about part 94, tool 96 and process 98. This material information is obtained from the material properties database 90. In the representative embodiment, the material to be used is initially determined by the material selector module 72 (e.g., at step 44).

Each feature template 100 categorizes design information by functional geometry and includes information that can be used to infer design parameters from known design information. A feature template 100 can include part information (such as geometric attributes), tool information and process information. Thus, for example, processes knowledge (e.g., information about the flow of plastics), which is needed when designing a part, can be used during part design.

In the representative embodiment of the present invention, each feature template is implemented as an object-oriented structure that includes name of the feature, object constructor, geometric forms, function list, attributes, parametric relationships and engineering rules represented as equality and inequality constraints.

Examples of algorithms and the data structures that can be used to implement the core design module 76 are detailed in Appendix A.

The frame-based representation of knowledge utilized by the present invention can capture both form and function of a feature, enabling implementation of a complete product definition.

The tooling generator 78 takes as input the detailed part drawings produced by the core design module and produces a prototype tool. The tooling generator of the present invention is an example of the improvement in downstream operations that are facilitated by the integrated part, tool, and process specification arising from the approach of the present invention.

The tool fabrication process planner module 80 is an expert system that determines the most appropriate fabrication method(s) for tool components, sequences the fabrication operations, and allocates shop resources to deliver tools in the shortest possible time.

Figure 6:
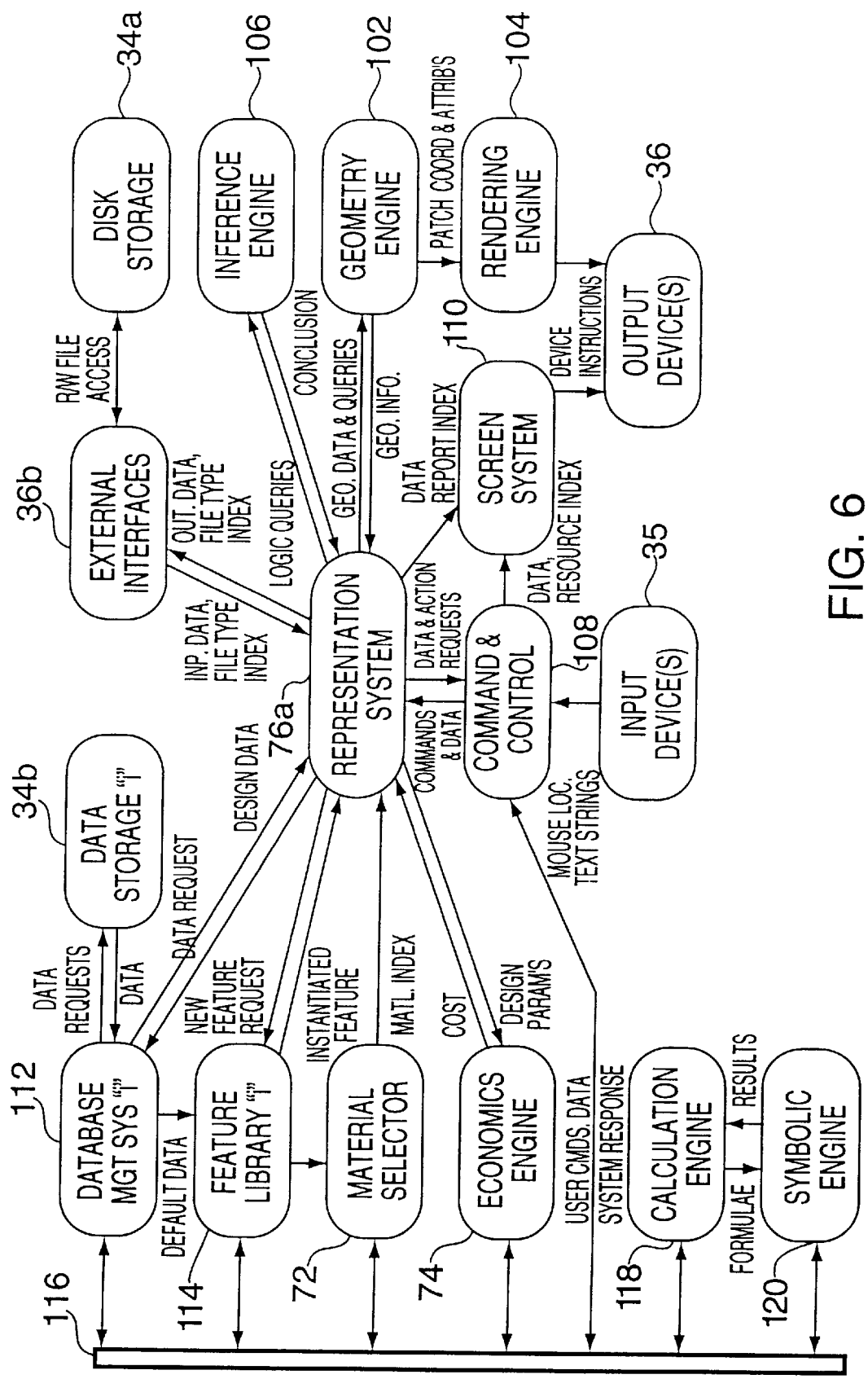
FIG. 6 is a block diagram of the system architecture of the present invention.

Turning now to FIG. 6, there is illustrated in block diagram form is a more detailed diagram of the system architecture of a representative embodiment of the present invention.

The core design module 76 utilizes a representation system 76a. The representation system 76a, as discussed above, is a frame-based (or template) representation system that is arranged by form and function. The user inputs commands at an input device 35. The commands can be, for example, text strings and mouse location references. The commands are interpreted by a command and control module 108. User commands, data and requests for data can be sent via a bus 116 to the appropriate module or database. User commands and data are also sent to the representation system 76a of the core design module 76.

The representative embodiment of the present invention operates in a plurality of modes. These modes include material mode, part mode, tool mode and process mode. The system operates in these modes to allows a user to concentrate on the design of a particular element. For example, when in part mode, the user may be entering information or making decisions concerning the design of a part. Design decisions in each mode effect the other modes. For example, when in part mode, a change to the part design automatically modifies the tool and process design. These modifications can be seen when the user changes to the respective mode. As discussed above, a change to a single design feature (or sub-part) may dictate changes in a number of other features (or sub-parts), and the command and control module 108 implements and orchestrates such changes.

The command and control module 108 enables the user to change modes and to add, edit and delete objects from the design environment, to interrogate or add to a system database, and to receive other commands and dispatch them to the appropriate module.

The representation system 76a of the present invention can be regarded as the hub of the concurrent design process. As such, it can freely interchange data with existing commercial software from a variety of environments. This eliminates the need to create a wide variety of system functionalities that are presently available. For example, the present invention can export data to spreadsheet and scientific graphics packages, and export graphics and reports to word processing and desktop publishing programs.

In the representative embodiment, an external interface module 36b controls data exchange with external software. The external interface module also enables read/write access to disk storage 34a.

The representative embodiment supports, amongst others, the following interfaces: to CAD systems—IGES, ProEngineer and IDEAS; for FEM structural analysis—PATRAN/NASTRAN and IDEAS; for FEM molding filling, cooling and shrinkage analysis—C-FLOW, IDEAS, Moldflow and TMC; and for tool design—IDEAS, Pro-Engineer and DME Moldbase Catalog.

A geometry engine 102 (or solids modeler) produces a geometric representation of the solid part suitable for display by a rendering engine 104. In the representative embodiment, the geometry engine 102 also generates the mold cavity geometry from the part geometry. The geometry engine can interpret "construction entities" used in the drawing process, e.g., points, lines and planes of reference, in addition to the physical components of the part under design. The geometry engine 102 can generate tangency, orthogonality, surface normal information, etc. for feature placement on the part. The geometry engine 102 can also rotate, translate and scale single features on the part to the entire part.

In the representative embodiment, the Pro-Engineer CAD system, available from Parametric Technology Inc, is used as the rendering engine 104. The representation system 76a interfaces with Pro-Engineer to create drawings of the part and tool design, as discussed below. The rendering engine 104 can display a graphical representation of the surfaces generated by the geometry engine 102. The rending is sufficiently rapid to allow realtime interaction with the part (e.g., scaling, translation, rotation, zooming of views).

A screen system 110 controls the display of data on an output device 36, as is known in the art. The representative embodiment utilizes a window-based system.

The representation system 76a is coupled to an inference engine 102. The inference engine 102 includes a set of design rules. The design rules incorporate design knowledge, for example, that a change in one feature requires a change in surrounding features.

The representation system 76a, in conjunction with a feature library 114, stores knowledge of material, product, tooling and process behavior and their interactions. As discussed above, this knowledge is arranged using frame-based data structures, or templates. The detailed design of each sub-part added to the part is completed using this knowledge, requiring a minimum amount of user specification to fully define the geometric parameters of that element.

According to the present invention, this knowledge is arranged in a hierarchical fashion. There are four parent objects: the material (e.g., polymer resin or composite), the part, the tool (e.g., mold hardware) and the process (e.g., injection machine operating parameters). Each of these parent objects can be regarded as being composed of a hierarchy of offspring objects that represent some functional class of behavior that belongs to that domain. Furthermore, the four classes interact, or share information owing to the interrelationships between the material properties, part performance and geometry, tool construction, and process conditions. These interactions can be shared, as appropriate, by all objects in the hierarchical structure. As an amalgamation, the four domains represent an integrated product-process model built from the underlying engineering design methodology contained within the "objects" in the hierarchical structure.

The material representation is a traditional database approach that stores and reports the collection of material properties needed by the designer. Additionally, each material can be viewed as an object (e.g., a material template) that is comprised of child objects that are the individual properties (e.g., viscosity, thermal conductivity, heat capacity, etc.). These property objects have various rules that provide for reconciliation of a property request with the various forms in which data may be stored. For example, when a melt rate of a specific resin at a specific temperature and shear rate is required, the rule would examine the data available for the specific resin and decide how best to satisfy the request—extrapolate, interpolate or evaluate. Each material template can exchange information with the feature templates.

The feature templates are able to generate default values for the feature with minimal user specification. These defaults utilize engineering knowledge and can reflect both structural and moldability requirements. As an example, a boss for a self-tapping screw can be suitably detailed with no more information that the root diameter of the screw and the height of the boss. Structural requirements are handled by application of classic stress-strain formula for various shapes with standard load patterns.

In the field of injection molding of plastics, the representation system 76a also includes a tool cavity generation system 99 that automatically generates tool cavity dimensions from a solid cavity block.

A database system 112 includes a variety of stored data services. The database system 112 includes the material properties database 90 and a product design database 126 (storing a products engineering requirements). The present invention allows databases to be added to the database system 112 as needed. For example, if the present invention is used in the field of injection molding plastics, an injection molding machinery characteristics database 122 (providing generic operating parameters for classes of molding machinery) and a mold-making machinery characteristics database 124 could be added.

A calculation engine 118 generates the parametric values for newly instantiated or modified features (or sub-parts) by evaluating a set of engineering calculations. Engineering formulae are embedded in each feature template (when needed). However, these formulae can also be stored external to the templates, in one location, to allow sharing and to save storage space. Examples of calculations supported by the present invention include stress/strain calculations such as solid beam deflection, snap fit (cantilever variation), and hoop stress in annulus; impact calculations; mold filling calculations such as pressure drop, flow orientation and weld line location; mold cooling calculations; and shrinkage/warpage calculations.

The calculation engine 118 interacts with a symbolic engine 120 that provides the solution of equations involving geometric parameters, material properties and processing variables.

Figure 7:
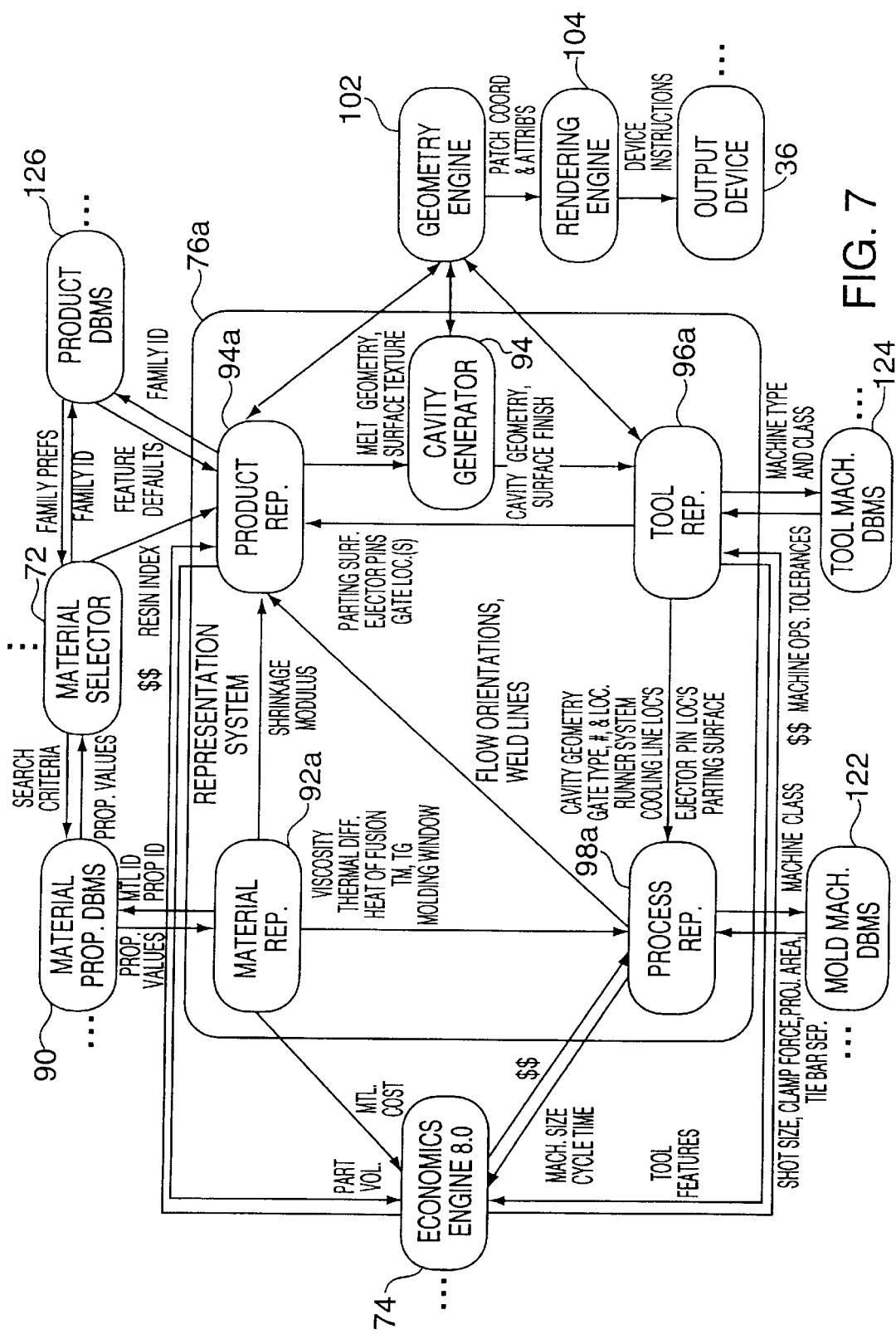
FIG. 7 is block diagram of a system architecture diagram for an injection molding plastics system.

Turning now to FIG. 7, there is illustrated in block diagram form a system architecture diagram for an injection molding plastics system. The tool cavity generation system 99 that automatically generates tool cavity dimensions from a solid cavity block (discussed above) is shown, along with the injection molding machinery characteristics database 122 and the mold-making machinery characteristics database 124. FIG. 7 illustrates that the components of the present invention can be simply modified or enhanced for many various applications.

The constraints of one feature can refer to attributes of another feature. These constraints can be defined in the absence of the external feature to which they refer. The representation system 76a provides connectivity information for all features (or sub-parts) in a part. Automatic detection of changes to connectivity information takes place when a feature is added, removed or edited. For example, a designer may wish to introduce parametric relationships between features (or sub-parts) during construction of a part. The designer may wish to locate a boss on a wall so that the boss' position depends on the position of the wall. Then, if the wall is moved, the boss will move with it. In addition, the designer may also want to specify that the boss is located at the center of the wall. If the wall is later resized, the boss is automatically repositioned. Both examples require that the boss be sensitive to changes in the wall's parameters. These relationship are supported by the present invention's ability to interpret arbitrary algebraic expressions.

Constraints (or rules) can be of several types. The following is a list of typical types of constraints supported by the present invention as well as an example of each constraint:

Constant: The thickness of the wall is 0.125 inches.

Computed: The cost of the part is $5 times its volume times its density.

Referenced: The geometry of the mold activity is the same as the outside geometry of the plastic part.

Conditional: If the bending stress is greater than material yield stress, use reinforcing ribs or gussets.

Lookup: From the mold base catalog, select the plates that will accommodate the internal cavity.

Iterative: Find the lowest cost combination of wall thickness and material types with a weight less than 1 lb and deflection less than one hundredth of an inch.

Geometric: The A-plate should always align with the B-plate in a mold.

External: Procedures based on external analysis results.

As stated above, the present invention can interface with CAD programs, such as the Pro-Engineer CAD program. The following are examples of typical instructions (and related explanations) that a user can enter using the input device 35. These instructions will be interpreted by the command and control module 108 of the present invention. The examples relate to designing the body of an electronic enclosure having a four sided box shaped housing that can be made of nylon or polycarbonate. The requirements of the part are that the uniform pressure on the base wall is 5 psi, the maximum allowable deflection of the base plate is 0.125 inches and the maximum part cost is $1. A boss of diameter 0.25 inches, height 0.75 inches) is located a the center of the base plate.

```
Restore("BasicObjects")
   - Loads basic wall and boss templates and
   material properties into the system.
ListT( )
   - Lists available templates
ListI( )
   - Lists available instances of templates
ListG( )
   - Lists other objects in the system
CreateI(:WallTemplate, BaseWall)
   - creates a base wall; the system will query
   for three size dimensions and placement
   information.
CreateI(:WallTemplate, Sidewall1)
CreateI(:WallTemplate, SideWall2)
CreateI(:WallTemplate, SideWall3)
CreateI(:WallTemplate, SideWall4)
   - creates four side walls; the system will
   query for the three side dimensions and
   placement information for each wall.
CreateI(:BossTemplate, Boss1)
   - creates a boss; the system will query for
   height and diameter dimensions and placement
   information for the boss.
ModifyAttr(:Boss1, X, :BaseWali.Width/2)
ModifyAttr(:Boss1, Y, :BaseWall.Length/2)
   - used to move the boss to the center of the
   plate if not placed correctly. These two
   statements define a parametric relationship
   which constrains the boss to the center of the
   base wall.
ModifyAttr(:Boss1, X, 1.0 + :BaseWall.Width/2)
ModifyAttr(:Boss1, Y, 1.0 + :BaseWall.Length/2)
   - Constrains the boss to be offset one inch in
   the X and Y directions form the centre of the
   base wall.
Create0(PartData)
AddAttr(:PartData, Material, :Nylon)
AddAttr(:PartData, MaxCost, :1.00)
AddAttr(:PartData, Partcost,
   Cost (Material. PricePerPound))
AddAttr(:BaseWall, Pressure, 5.0)
```

-continued

```
ModifyAttr(:Boss1, Diameter,1.2*:BaseWall.Thickness)
   - modifies the diameter attribute of the boss
ModifyAttr(:Basswall, Thickness, 0.125)
   - modifies the thickness of the base wall.
ModifyAttr ( PartData, Material, :Polycarbonate)
   - change the material to polycarbonate.
Save ("work")
   - saves the model
Restore ("work")
   - retrieves the model
AddAttr(:WallTemplate, Wallvolume,
   Length*Width*Thickness)
AddAttr(:WallTemplate, VolumeConstraint,
   WallVoiume >25.0)
   - adds a volume constraint; these two
   instructions an attribute and compute the
   volume. The computed volume is used to
   evaluate the volume constraint.
CreateT(SeparationwallTemplate, 'Gencost', 'Wall')
   creates a new template named
   "SeparationWallTemplate"
AddAttr(:SeparationWallTemplate, Thickness,
   0.75 * Attachedwall( ).Thickness)
   - adds a constraint that the separation wall's
   thickness is always 0.75 times the attached
   wall's thickness
CreateI(:SeparationWallTemplate, SeparationWall)
   - creates a new instance of a wall; the system
   will query for the size dimensions and
   placement information.
```

It is noted that the above instructions are merely examples of the types of instructions that can be interpreted by the system of the present invention. Instructions can also be entered using GUI commands, via, for example, a mouse, or using voice recognition techniques or natural language commands.

As shown in the above examples, when a template has been created, an instance of the template can then be created, where actual dimensions and other parametric information is supplied. In the above example, the dimensions and parametric information is mostly supplied by the user. However, the present invention can include templates having rules that supply the dimensions and parametric information based upon known factors, such as the function of the object or known attributes about other related objects.

The following describes a typical design scenario consisting of designer interactions and system responses as it applies to the design of a flat wall with an attached boss:

The designer starts by instantiating the nominal wall feature and uses the add-on operation to provide "Fasten" functionality. In this example, the system searches for a function template using "Fasten" as the search criteria and provides the user with the boss feature. (The system may also provide a list of other features that can have a "Fasten" functionality.) The user specifies the parameters for the boss such as dimension and positioning information.

Based on the selection, the reasoning attributes of the feature template are evaluated and the system examines the appropriate constraints. The constraints retrieve necessary additional information from other feature templates, look-up tables and the material database 90. The constraints that pertain to the feature "boss" are evaluated, and it is found that the thickness of the boss is adequate to support the applied load. However, while considering the mold fill criteria, the thickness exceeds the manufacturer's recommendation (as retrieved from the manufacturer's external database) for the selected material.

Depending on the constraint evaluation results, the user is notified through one of the following mechanisms:

warning messages, error messages and design change recommendations. If a unique and unambiguous solution exists, the system will automate the solution design change process. In all cases, the system's reasoning and engineering basis for the recommendations are provided. In the boss example, the system notifies the user that the "BOSS IS TOO THICK" and recommends a range of appropriate thickness values for the selected material that satisfies both the mold fill and the strength criteria.

If the user decided to accept the system's recommended design changes, they are automatically executed by the system. In the example, the user has selects a value within the suggested range and the system reinstantiated the boss accordingly.

At any time the user has the ability to modify the feature attribute values and the system processes the effect of these changes. In the boss design scenario, the load is increased and based on structural evaluation, the designer is notified that the boss requires additional reinforcement. The system recommendation is to add three gussets of given dimensions to withstand the new load and this is accepted by the designer. This results in reinstantiation of a boss with three gussets.

When the geometry is determined, moldability constraints further shape the part. A box, for example, uses orientation with respect to the tool draw directions to apply draft by flaring the side walls relative to the base, and a radius equal to the wall thickness assigned by the above-mentioned process is applied to all edges and corners. The interpretation of the draft angle operator is left to individual function-form entities. An "attach-boss" feature, for example, would modify the boss diameter at the base to be greater than that at the top to create a sloping of the walls in contrast to the approach used by the "enclose-box" construct.

The present invention supports the grouping of sub-parts into new sub-parts or parts. Accordingly, a macrofeature template can be created, as discussed above, being an assembly of feature templates and/or other macro-feature templates. A macro-feature is therefore an instance of an assembly of objects created according to a macro-feature template.

A feature template typically represents a sub-part. However, the frame-based representation scheme of the present invention is flexible and can represent entities at different levels in the design hierarchy. Thus, according to the present invention, a feature template may also represent a part (wherein the part is the feature) or an assembly of parts (wherein the assembly is the feature).

The present invention provides a group of external objects that characterize interactions between the part under design and the part's environment. Typical interactions in this category include structural, thermal and EMI constraints. Additionally, parts which have been previously designed can be introduced to the design of a new part as an external object.

When the variables of a constraint relationship are not known, the system automatically masks or disables that constraint and flags it as "not evaluated". When all variables to a constraint are known, the system evaluates the appropriate procedures to check that the constraint relationship is satisfied. The system can identify constraint violations, and can facilitate the designer be identifying potential solutions to the violation. Where a unique and unambiguous solution exists, it can be automatically implemented by the representation system 76a. Accordingly, in the representative embodiment, feature templates have access to analytical routines for structural, thermal, flow, and EMI analyses.

The following is an a description of a high level pseudocode describing the functions performed by the core design module 76 when adding a new instance of a template. This pseudo-code is representative only, and in this example, is limited to creating a housing for an electrical component:

1. Initiate NEW MODEL
2. NUL PART
   2a. Volume=0
3. NUL TOOL
   3a. 2 planes
4. NUL PROCESS
   4a. No Spec
5. NUL MATERIAL
6. Select Material
7. Specify Application:—Electrical Enclosure {Response received from user}
8. Specify Environment:—Household
9. Set Default Constraints
10. Specify/Edit Constraints
11. Select MATERIAL Index ABS
12. Add FUNCTION FORM
    12a. Input Minimal Geometry & Orientation, Length, Width, Height, and normal vector to deck.
    12b. Update TOOL
    12c. Update PROCESS
    12d. Update MATERIAL
    12e. Computer Unspecified Geometry
    12f. Update PART
    12g. Update TOOL
    12h. Update PROCESS
    12i. Update MATERIAL Update PART
1. Notify Attached Features
2. Compute Part Volume
3. Compute Projected Area
4. Compute Heat Content Update TOOL
1. Modify Core/Cavity Insert Dimensions
2. Modify A&B Plate Dimensions to fit core/cavity Inserts Update PROCESS
1. Modify Clamp_Force(Projected Area)
2. Modify Shot_Size (Part Volume)
3. Modify Machine_Size(Clamp, Shot, Tool_Size)

Update MATERIAL
1. Update Machine Effect on Properties
2. Update Flow Orientations
3. Update Core/Skin Proportions

EXAMPLE

The power of the approach of the present invention in generating both configurational and geometric design is best illustrated by example, in this case, in the field of plastics. The example involves the development effort in the design of injection molded plastic parts. It is noted that this field of use is only an example, and the scope of the invention is not so limited.

Successful design of injection molded plastic parts requires extensive knowledge of material properties and behavior, tooling, injection conditions and other processing parameters. This complex relationship between plastic product design and the cost and quality of the product demands design experts with many years of experience who understand the interaction of these variables.

Polymer part production is, by its very nature, an activity that demands concurrency. Advanced polymer materials derive their properties from the material's microstructure, and this microstructure evolves from the processing steps that transform the feed resin material from a particulate solid to a melt that is then shaped, formed, and subsequently cooled to produce the final part. The end use properties, then, are the combination of raw material properties, the machine and tooling geometry through which the material passes, and the processing condition that prevail. Any design derived solely from consideration of end product form and function is likely to fail either because over-design will make it too costly, process influences on material performance will make it perform unreliably, or product geometry will lead to impossible tooling or process requirements.

The design methodology of the present invention is ideally suited for injection molded plastic part as the present invention incorporates all stages of product design, from material selection to conceptual and detailed design to process design and manufacture at a first integrated design phase.

In order to successfully design injection molded plastic parts, all aspects of the product life cycle need to be taken into account, requiring an extensive amount of knowledge be available to the designer. The present invention captures the knowledge existing in different disciplines and puts this knowledge to use at the first design phase to enhance the quality of overall design, including the part design, the tool design and the process design.

Consider one element of the design of a PC housing: the attachment of the computer mother-board to the enclosure's bottom. There are many ways of providing for this functionality in plastic parts. For simplicity, this example reduces the scope of consideration to attachment by screw, which the present invention would present to the user as an alternative family of forms in the attachment family. This simple selection establishes a chain of design decisions that embody part detailing, tooling and process considerations, most of which are amenable to automated completion.

Figure 8:
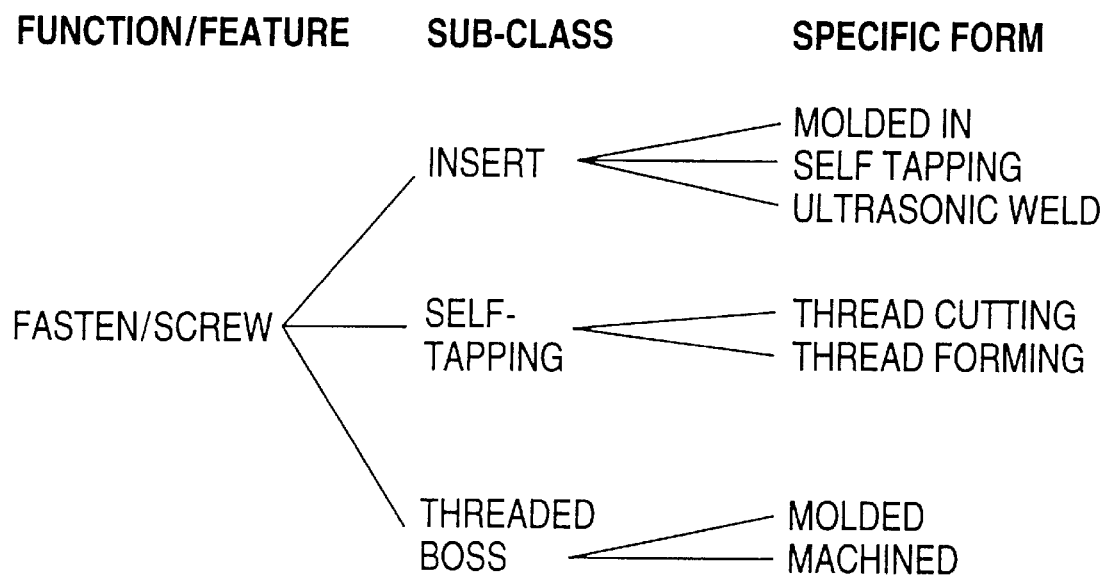
FIG. 8 is an example of a function sub-hierarchy.

To begin, use of a screw suggests a boss as the appropriate form for the desired functionality. The location of the mounting points relative to the enclosure walls permits automatic selection of a free standing boss structure rather than a form integrated into the wall itself, and the underside clearance of the mother-board dictates the boss height. The designer then has additional options in specifying the nature of the connection. The system may be allowed to choose a "default" connection type based on knowledge of the product type and use, or the designer's general preference, or a specific form can be manually selected. A typical hierarchical arrangement is shown in FIG. 8. In any approach, however, the choice provides the additional information needed to detail the geometry. The object oriented software implementation allows the sharing or "inheritance" of design rules from the root to the leaves of the family tree that is shown in FIG. 8. As a result, it is not necessary to repeat design procedures common to all bosses in each of the offspring forms. Assume that a self tapping screw is chosen as the selected form.

Knowing the screw size immediately fixes the inside diameter of the boss as the root diameter of the screw. Typically, an outside diameter of twice the boss' inner diameter would serve as adequate to resist failure from hoop stresses in the boss, but a rigorous calculation drawing a value from the property database 90 could be substituted. Furthermore, the length of the pilot hole needs to be extended to twice the length of thread contact to sustain the stresses imposed by the screw. Simple cantilever beam calculations can automatically determine the suitability of the boss to withstand any lateral forces that might be applied to the board. If inadequate, the system would suggest the addition of gussets or a web depending upon the boss' proximity to the enclosure walls.

While these calculations ensure that the primary structural requirements of the boss are satisfied, more work remains to account for moldability demands. The center hole of the boss is counter-bored to eliminate the differential shrinkage problems that would occur from the thick base section mounted on the thinner housing wall. Sharp corners represent stress concentrators and flow inhibitors that are a common source of part failure in plastics. These can be removed by automatically radiusing the transitions. Typically a radius of fifty percent of the wall thickness is used, but this value can be determined algorithmically. In fact, the radius at the boss base is a good example of compromise on the standard value. On one hand, a large radius would provide better load bearing capabilities, while on the other it exacerbates the problems of differential shrinkage resulting from the thickness of the boss wall relative to that of the base. A minimum radius of twenty five percent can be applied here, or a material specific calculation invoked. Since the system detects that the boss core aligns with the pull direction, draft angle is applied to inner and outer walls of the boss to aid in part ejection. The completed geometry then dictates an incremental addition to the part volume with an associated contribution to part cost based on material pricing.

With the geometric specifications complete, the tooling and process ramifications of the newly added form can be detailed. The part geometry can be corrected for shrinkage to generate the dimensions of the mold cavity. Since the boss fills from base to cap, anisotropic shrinkage corrections can be applied to use different values in the flow and cross to ejection force calculations. Using a function-based tool costing model, the contribution of the added boss to tool production cost can be immediately determined.

The part cooling time represents the major component of process cycle time, and this can be quickly estimated as four times the part Fourier number (the square of the thickest dimension divided by the melt thermal diffusivity). The boss wall thickness can be automatically checked against the existing list of forms to determine the maximum critical dimension. If freeze off is to averted without excessive cycle time, the fill time has to be less than, but comparable to, the cooling time. This provides a means of algorithmically determining a pressure drop required, and thus the feature's contribution to the overall machine requirements for mold filing, and the processing costs associated with its operation. Special process attributes can be associated with a feature, such as a weld line that may form in the boss due to unequal rates of fill resulting from the flow front's progression under the base.

The "common language" used by the present invention to enable it to perform the above described functionality is the feature template representation of the present invention. By replicating decision processes across all of the supported part functionalities, the present invention captures and stores the designer's intent, and transforms it to a fully detailed design that embraces best available design guidance.

The present invention can support the automated detailing of part, tool, and process when applied to injection molding products. Injection molding is merely one example of illustrating one use of the present invention. The method and apparatus of the present invention can be used in many fields of design, including, but not limited to, for example, compression molding, blow molding, resin transfer molding, die casting and metal die casting, reactive molding, thermoset molding, sheet metal forming, metal machining, investment casting, and the design of integrated circuit chips, electronic circuit boards, furniture, housing and buildings, roads, bridges, automobiles, aircraft, ships, computers, telecommunications devices, video display and transmission devices, photographic systems, and kitchen appliances, and the components for these products. Further, the approach of the present invention is not predicated upon a single designer deciding all aspects of a project, although it can be so used. The single, common data representation of the present invention supports the multiple functionalities of the design team, allowing overlap of normally sequential designs of part, tool, and process.

Appendix A

Abstract Algorithms and Data Structures

Expressions

The set of all expressions Exp, is comprised of elements that are sixtuples of the form:

$$(c, T, t, f, v, A) \in \text{Exp} \leftrightarrow \begin{cases} c \in \text{Boolean} \\ T = t_1 \times t_2 \times \ldots \times t_n \\ t \text{ is a set.} \\ c = \text{TRUE} \Rightarrow f: T \to t \\ c = \text{TRUE} \Rightarrow v = f(\text{value}(\text{eval}(A))) \in t \\ c = \text{FALSE} \Rightarrow v = <\text{UNDEFINED}> \\ c = \text{TRUE} \Rightarrow \text{value}(\text{eval}(A)) \in T \end{cases}$$

Interpretation:

c Is a boolean variable that defines when the application of the function f returns a valid value.

T Is a set of valid argument types.

t Is the return type.

f Is the function that maps values in T to values in t.

v Maintains the current value of f(value(eval(A)))

A Is the (ordered) set of arguments to f.

Functions on Expressions

Given an expression the function value returns the currently computed value stored in the state variable v.

$$\frac{(c, T, t, f, v, A) \in \text{Exp}}{\text{value}(c, T, t, f, v, A) \equiv v}$$

We extend the function value to operate on ordered sets of expressions.

$$\frac{E_1 \in \text{Exp}, E_2 \in \text{Exp}, \ldots, E_n \in \text{Exp}}{\text{value}(E_1, E_2, \ldots, E_n) \equiv}$$
$$(\text{value}(E_1), \text{value}(E_2), \ldots, \text{value}(E_n))$$

The function eval conditionally recomputes the value of the state variable v. If the conditional variable c is true then the result of eval will set the state variable v to the result of applying the function f to its arguments A.

$$\frac{(c, T, t, f, v, A) \in \text{Exp} \land c = \text{TRUE}}{\text{eval}(c, T, t, f, v, A) \equiv}$$
$$(c, T, t, f, f(\text{value}(\text{eval}(A))), A)$$

-continued
$$\frac{(c, T, t, f, v, A) \in \text{Exp} \land c = \text{FALSE}}{\text{eval}(c, T, t, f, v, A) \equiv}$$
$$(c, T, t, f, <\text{UNDEFINED}>, A)$$

We extend the function eval to operate on ordered sets of expressions.

$$\frac{E_1 \in \text{Exp}, E_2 \in \text{Exp}, \ldots, E_n \in \text{Exp}}{\text{eval}(E_1, E_2, \ldots, E_n) \equiv}$$
$$(\text{eval}(E_1), \text{eval}(E_2), \ldots, \text{eval}(E_n))$$

Dependent Objects

Dependent objects are objects that contain both "symbolic" and "actual" references to other dependent objects. Symbolic references are used to refer to dependent objects that currently do not exist. Actual references are references to existing dependent objects that correspond to one of the symbolic references defined by a given dependent object. Optionally, a dependent object, x, may define a symbol that can be used by other dependent objects to refer to x.

Given some universe of "symbols" $\Sigma$.

$$(D, R, \gamma) \in DO \leftrightarrow \begin{cases} D \subseteq \Sigma \\ R \subseteq DO \\ \gamma \in \Sigma \end{cases}$$

$\Sigma$ contains a special symbol $\epsilon$ which is equivalent to "no symbol" or the "empty symbol", and has the following properties:

$$a, b \in \Sigma \land (a \neq \epsilon \land b \neq \epsilon) \Rightarrow a \equiv b \lor a \neq b$$

$$a, b \in \Sigma \land (a \equiv \epsilon \lor b \equiv \epsilon) \Rightarrow a \neq b$$

Interpretation:

D Represents a set of "symbolic" references to objects that a given dependent object depends on.

R Represents a set of "actual" references that a given dependent object depends on.

$\gamma$ Represents an optional "symbol" that is defined by this dependent object.

Functions on Dependent Objects

The function resolves is a predicate that defines when a "symbolic" reference "resolves" or "identifies" a dependent object.

$$\frac{x \in \Sigma \land (D, R, \gamma) \in DO \land x \equiv \gamma}{\text{resolves}(x, (D, R, \gamma)) \equiv \text{TRUE}}$$

$$\frac{x \in \Sigma \land (D, R, \gamma) \in DO \land x \neq \gamma}{\text{resolves}(x, (D, R, \gamma)) \equiv \text{FALSE}}$$

The function independent is a predicate that defines when a given dependent object is "independent", i.e. it has no symbolic references $$\frac{(D, R, \gamma) \in DO \land D \equiv \emptyset}{\text{independent}(D, R, \gamma) \equiv \text{TRUE}}$$

$$\frac{(D, R, \gamma) \in DO \land D \neq \emptyset}{\text{independent}(D, R, \gamma) \equiv \text{FALSE}}$$

The function add_references adds an "actual" reference to a dependent object provided that the actual reference is resolved by some "symbolic" reference in the dependent object.

$$\frac{(D, R, \gamma) \in DO \wedge r \in DO}{\text{add\_reference}((D, R, \gamma), r) \equiv (D, R \cup \{r\}, \gamma)}$$

The function remove_reference removes an "actual" reference from a given dependent object.

$$\frac{(D, R, \gamma) \in DO \wedge r \in DO}{\text{remove\_reference}((D, R, \gamma), r) \equiv (D, R - [r], \gamma)}$$

The function unresolved_references computes all of the "symbolic" references that do not have a corresponding "actual" reference.

$$\frac{(D, R, \gamma) \in DO}{\text{unresolved\_references}(D, R, \gamma) \equiv \{x \in D | (\forall r \in R | \neg \text{resolves}(x, r))\}}$$

The function satisfied is a predicate that defines when a dependent object is satisfied, i.e. there exists an "actual" reference for each of the "symbolic" references in a given dependent object.

$$\frac{(D, R, \gamma) \in DO \wedge \text{unresolved\_references}(D, R, \gamma) = \emptyset}{\text{satisfied}(D, R, \gamma) \equiv \text{TRUE}}$$

$$\frac{(D, R, \gamma) \in DO \wedge \text{unresolved\_references}(D, R, \gamma) \neq \emptyset}{\text{satisfied}(D, R, \gamma) \equiv \text{FALSE}}$$

The function resolve_references resolves all possible "symbolic" references given a universe of dependent objects.

$$\frac{(D, R, \gamma) \in DO \wedge U \subseteq DO \wedge (\exists x \in \text{unresolved\_references}(D, R, \gamma) \exists u \in U | \text{resolves}(D, R, \gamma))}{\text{resolve\_references}(D, R, \gamma) \equiv \text{resolve\_references}(\text{add\_references}((D, R, \gamma), u), U)}$$

$$\frac{(D, R, \gamma) \in U \subseteq DO \wedge (\forall x \in \text{unresolved\_references}(D, R, \gamma) \forall u \in U | \neg \text{resolves}(D, R, \gamma))}{\text{resolve\_references}(D, R, \gamma) \equiv (D, R, \gamma)}$$

The function resolved_references returns the set of "actual" references already resolved against some universe of dependent objects.

$$\frac{(D, R, \gamma) \in DO}{\text{resolved\_references}(D, R, \gamma) \equiv R}$$

Unsatisfied Objects

The set of unsatisfied objects USO is the subset of dependent objects that are unsatisfied. I.E.:

$$(D,R,\gamma) \in USO \leftrightarrow (\frac{(D,R,\gamma) \in DO}{\neg \text{satisfied}(D,R,\gamma)})$$

Interpretation:

D Represents a set of "symbolic" references to objects that a given dependent object depends on.

R Represents a set of "actual" references that a given dependent object depends on.

γ Represents an optional "symbol" that is defined by this dependent object.

7.3.1 Functions on Unsatisfied Objects

The function satisfies computes the subset of unsatisfied objects that would be partially satisfied if the given dependent object was added to the set of dependent objects.

$$\frac{x \in DO \wedge y \subseteq USO}{\frac{a \subseteq USO \wedge b \subseteq USO \wedge (\exists (D,R,\gamma) \in b \exists d \in D | \text{resolves}(d,x))}{\text{satisfy\_set}(a,b) \equiv \text{satisfy\_set}(a \cup \{(D,R,\gamma)\}, b - \{(D,R,\gamma)\})} \vee \frac{a \subseteq USO \wedge b \subseteq USO \wedge (\forall (D,R,\gamma) \in b \forall d \in D | \neg \text{resolves}(d,x))}{\text{satisfy\_set}(a,b) \equiv a}}{\text{satisfies}(x,y) \equiv \text{satisfy\_set}(\emptyset, y)}$$

The function resolve adds on "actual" reference to all unsatisfied objects that contain a "symbolic" reference to the given dependent object. resolve returns the set of fully satisfied objects that results from resolving references.

$$\frac{\begin{array}{c} x \subseteq USO \wedge y \subseteq DO \wedge \\ S \subseteq USO \wedge \overline{Q} \subseteq DO \wedge \overline{Q} \cap USO = \emptyset \wedge \\ a \in S \wedge z \equiv \text{resolve\_references}(a, \{y\}) \wedge S' \equiv S - a \end{array}}{\frac{\frac{\text{satisfied}(z)}{Q' \equiv Q \cup \{z\}} \vee \frac{\neg \text{satisfied}(z)}{Q' \equiv Q}}{\frac{S' \equiv \emptyset}{\text{resolved\_set}(S,Q) \equiv Q'} \vee \frac{S' \neq \emptyset}{\text{resolved\_set}(S,Q) \equiv \text{resolved\_set}(S',Q')}}}{\text{resolve}(x,y) \equiv \text{resolved\_set}(x, \emptyset)}$$

Dependancy Module

The dependancy module is a triple:

$$(G,S,U) \in DM \leftrightarrow \begin{cases} G \text{ is an acyclic directed graph.} \\ S \subseteq V(G) \wedge S \subseteq DO \wedge S \cap USO \equiv \emptyset \\ U \subseteq \overline{V(G)} \wedge U \subseteq USO \\ V(G) \equiv S \cup U \wedge S \cap U \equiv \emptyset \\ E(G) \equiv \{(x,y) | x,y \in V(G) \wedge (D,R,\gamma) \equiv y \wedge d \in D \wedge \text{resolves}(d,x)\} \end{cases}$$

interpretation:

G Is the directed graph of dependencies between relations in the product model.

S Is the set of relations that can be successfully computed because all of their inputs are well defined.

U Is the set of relations that cannot be computed because at least one input is undefined.

7.4.1 Functions on a dependency module $$\frac{\begin{array}{c}(G,S,U) \in DG \wedge x \in DO \wedge \\ x' = \text{resolve\_references}(x,V(G)) \wedge SAT = \text{satisfies}(x',U) \wedge \Delta S = \text{reslove}(SAT,x') \wedge \\ G' = (V(G) \cup \{x'\}, E(G) \cup \{(a,x')|a \in \text{resolved\_references}(x')\} \cup \{(x',b)|b \in SAT\})\end{array}}{\frac{\text{satisfied}(x')}{S' = S \cup \Delta S \cup \{x'\} \wedge U' = U - \Delta S} \vee \frac{\neg\text{satisfied}(x')}{S' = S \cup \Delta S \wedge U' = U - \Delta S \cup \{x'\}}}$$

$$\frac{\text{cycle}(G')}{\text{add\_object}((G,S,U),x) = <\text{ERROR}>} \vee \frac{\neg\text{cycle}(G')}{\text{add\_object}((G,S,U),x) = \text{update\_dependencies}((G',S',U'),SAT)}$$

Functions on Dependency Graph $$\frac{\begin{array}{c}(G,S,U) \in DG \wedge x \in DO \\ x' = \text{resolve\_references}(x,V(G)) \wedge SAT = \text{satisifies}(x',U) \wedge \Delta S = \text{resolve}(SAT,x') \wedge \\ G' = (V(G) \cup \{x'\}, \{(a,x')|a \in \text{resolved\_references}(x')\} \cup E(G) \cup \{(x',b)|b \in SAT\})\end{array}}{}$$

$$\frac{\text{satisfied}(x')}{S' = S \cup \Delta S \cup \{x'\}} \quad \frac{\text{satisfied}(x')}{U' = U - \Delta S}$$

$$\frac{\neg\text{satisfied}(x')}{S' = S \cup \Delta S} \quad \frac{\neg\text{satisfied}(x')}{U' = U - \Delta S \cup \{x'\}}$$

$$\frac{\text{cycle}(G')}{\text{add\_object}((G,S,U),x) = <\text{ERROR}>}$$

$$\frac{\neg\text{cycle}(G')}{\text{add\_object}((G,S,U),x) = \text{update\_dependencies}((G',S',U'),SAT)}$$

$$\frac{(G,S,U) \in DG \wedge x,y \in DO}{\text{substitute\_object}((G,S,U),x,y) = \text{add\_object}(\text{delete\_object}((G,S,U),x),y)}$$

$$\frac{\begin{array}{c}(G,S,U) \in DG \wedge x \in V(G) \wedge \\ \Delta U = \{b|(x,b) \in E(G)\} \wedge U' = U \cup \Delta U \wedge S' = S - \Delta U \wedge \\ G' = (V(G) - \{x\}, E(G) - \{(a,x)|(a,x) \in E(G)\} - \{(x,b)|(x,b) \in E(G)\})\end{array}}{}$$

$$\frac{\text{cycle}(G')}{\text{delete\_object}((G,S,U),x) = <\text{ERROR}>}$$

$$\frac{\neg\text{cycle}(G')}{\text{delete\_object}((G,S,U),x) = \text{update\_dependencies}((G',S',U'),\Delta U)}$$

Algorithm for detecting cycles in a directed graph
Input: a digraph G.
Output: TRUE if the graph contains a cycle, FALSE otherwise.
Performance: Proportional to $|E(G)|+|V(G)|$.

```
Given a digraph Q.
For all x in V(G) mark x vith +infinity.
X:={ x | x is in V(G) and |in(x)| = 0 }.
if X={ } tnen return TRUE.
i:=0
For x in X mark x vith i.
i:=i+1.
X:={ x | y is in X and x is in out(y) }
if X={ } then
    if there exists y in V(x) vith mark(y) = + infinity than return TRUE
    else return FALSE.
else
    if there exists x in X auch that mark(x) < i then return TRUE
    else goto 1.
```

What is claimed is:

1. A computer-based engineering design system to design a part, a tool to make the part, and the process to make the part, the design system comprising:

a processor;

a memory coupled to the processor, the memory storing at least one feature data record, each feature data record representing a respective primitive object having a predetermined function, each feature data record including a geometric data record for forming a shape of the primitive object, each feature data record including information corresponding to a tool to make the primitive object and a process to make the primitive object;

an input device receiving a request from the processor to design the part, the request including at least one prespecified function performed by the part; and a core design module executable by the processor and creating the part, the tool to make the part and process to make the part, the core design module utilizing the at least one feature data record in the memory to locate the at least one primitive object performing the at least one prespecified function.

2. The engineering design system of claim 1 further comprising an output device being coupled to the processor and displaying a graphical representation of the shape of the respective primitive object located by the processor.

3. The engineering design system of claim 2 wherein the shape of the respective primitive object is displayed on a user-specified location of the output device.

4. The engineering design system of claim 2 wherein the shape of the respective primitive object is displayed on a location of the output device specified by the core design module.

5. The engineering design system of claim 2 wherein the shape of the respective primitive object is displayed on a location of the output device specified by the core design module and a user.

6. The engineering design system of claim 2 wherein the shape of the respective primitive object is displayed on a location of the output device specified in the respective feature data record.

7. The engineering design system of claim 1 wherein the shape of the respective primitive object located by the processor is specified by a user.

8. The engineering design system of claim 1 wherein the shape of the respective primitive object located by the processor is determined by the core design module.

9. The engineering design system of claim 1 further comprising an interface to a computer-aided drafting system, the interface being coupled to the processor and transmitting a set of instructions defining the the shape of the respective primitive object to the computer-aided drafting system.

10. The engineering design system of claim 1 wherein each feature data record is representatively indexed using the shape of the primitive object.

11. The engineering design system of claim 1 wherein each feature data record represents a respective primitive object having more than one function.

12. The engineering design system of claim 1 wherein each feature data record represents a respective primitive object having one or more functions.

13. The engineering design system of claim 1 wherein the core design module simultaneously designs the part, the tool to make the part and the process to make the part.

14. A computer-based design method comprising the steps of:
 receiving a set of materials to make a part;
 selecting a preferred one of the set of materials to make the part;
 determining a set of design constraints as a function of characteristics of the preferred one of the set of materials; and
 simultaneously designing, within the set of design constraints, a part that is made from the selected material, a tool to make the part and a process to make the part, wherein the part, the tool and the process are simultaneously designed using at least one feature data record stored in a computer memory, each feature data record representing a primitive object having a predetermined function, each feature data record including a geometric data record forming a shape of the primitive object, each feature data record including information corresponding to a tool to make the primitive object and a process to make the primitive object.

15. A method for designing a tool to make a product and a process to make the product, the method comprising the steps of:
 receiving a set of constraint relationships that specify a desired function of the product;
 selecting a material from a set of materials to be used for making the product;
 providing a set of feature data records, each feature data record corresponding to a respective primitive object having a predefined function, each feature data record including shape information, tool information and process information corresponding to the respective primitive object;
 generating a selected feature data record corresponding to a primitive object having the desired function and capable of being made from the selected material, the selected feature data record being generated from the set of feature data records; and
 concurrently designing a tool drawing and a process specification to make the product as a function of the form information, the tool information and the process information in the selected feature data record.

16. A method for designing a product and a process to make the product, the method comprising the steps of:
 receiving a set of constraint relationships that specify a desired function of the product;
 selecting a material from a set of materials to be used for making the product;
 providing a set of feature data records, each feature data record corresponding to a respective primitive object having a predefined function, each feature data record including shape information, tool information and process information corresponding to the respective primitive object;
 generating a selected feature data record corresponding to a primitive object having the desired function and capable of being made from the selected material, the selected feature data record being generated from the set of feature data records; and
 concurrently designing a product drawing and a process specification to make the product as a function of the form information, the tool information and the process information in the selected feature data record.

17. A computer-based engineering design system for designing a part and a process to make the part, the system comprising:
 a processor;
 a memory coupled to the processor, the memory storing a plurality of feature data records, each feature data record corresponding to a respective primitive object having a predetermined function, each feature data record including a geometric shape representing a form of the respective primitive object, each feature data record including information relating to a tool to make the respective primitive object;
 an input device coupled to the processor receiving a request to design the part, the request including a predefined function performed by the part; and
 a core design module executable by the processor, the core design module designing the part and the process to make the part by accessing the plurality of feature data records in the memory to locate the respective primitive object substantially performing the predefined function.

18. A computer-based engineering design system to assist in designing a tool to make a part and a process to make the part, the system comprising:
 a processor;
 a memory coupled to the processor, the memory storing a plurality of feature data records, each feature data record corresponding to a respective primitive object having a predetermined function, each feature data record including a geometric shape representing a form of the respective primitive object, each feature data record including information relating to the tool to make the respective primitive object;
 an input device coupled to the processor receiving a request to design the part, the request including a predefined function performed by the part; and
 a core design module executable by the processor, the core design module designing the tool to make the part and the process to make the part by accessing the plurality of feature data records in the memory to locate the respective primitive object substantially performing the predefined function.

19. The computer-based engineering design system according to claim 17, wherein the core design module concurrently designs the part and the process to make the part.

20. The computer-based engineering design system according to claim 18, wherein the core design module concurrently designs the tool to make the part and the process to make the part.

21. The computer-based engineering design system according to claim 1, wherein each data record is indexed by the predetermined function of the primitive object.

22. The computer-based design method according to step 14, wherein each data record is indexed by the predetermined function.

23. The method according to claim 15, wherein each feature data record is indexed by the predefined function.

24. The method according to claim 16, wherein each data record is indexed by the predefined function.

25. The computer-based engineering design system according to claim 11, wherein each feature data record is indexed by the predetermined function.

26. The computer-based engineering design system according to claim 18, wherein each feature data record is indexed by the predetermined function.

* * * * *